United States Patent
Omori et al.

(10) Patent No.: US 10,305,441 B2
(45) Date of Patent: May 28, 2019

(54) COMMON MODE NOISE FILTER

(71) Applicant: Panasonic Intellectual Property Management Co., Ltd., Osaka (JP)

(72) Inventors: Yoshiharu Omori, Osaka (JP); Kenichi Matsushima, Hyogo (JP); Masakatsu Nawate, Fukui (JP); Ryohei Harada, Fukui (JP); Kenji Ueno, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 10 days.

(21) Appl. No.: 15/549,391

(22) PCT Filed: Dec. 7, 2015

(86) PCT No.: PCT/JP2015/006063
§ 371 (c)(1),
(2) Date: Aug. 8, 2017

(87) PCT Pub. No.: WO2016/162909
PCT Pub. Date: Oct. 13, 2016

(65) Prior Publication Data
US 2018/0041185 A1    Feb. 8, 2018

(30) Foreign Application Priority Data

Apr. 7, 2015    (JP) .................................. 2015-078183

(51) Int. Cl.
*H03H 7/09*    (2006.01)
*H03H 7/01*    (2006.01)
(Continued)

(52) U.S. Cl.
CPC .......... *H03H 7/427* (2013.01); *H01F 17/0013* (2013.01); *H03H 7/09* (2013.01);
(Continued)

(58) Field of Classification Search
CPC ... H03H 2001/0085; H03H 7/09; H03H 7/427
(Continued)

(56) References Cited

U.S. PATENT DOCUMENTS 6,229,425 B1    5/2001    Kobayashi
2003/0052766 A1    3/2003    Tomohiro et al.
(Continued)

FOREIGN PATENT DOCUMENTS

JP    2000-030945    1/2000
JP    2003-077727    3/2003
(Continued)

OTHER PUBLICATIONS

International Search Report of PCT application No. PCT/JP2015/006063 dated Feb. 23, 2016.

*Primary Examiner* — Rakesh B Patel
(74) *Attorney, Agent, or Firm* — McDermott Will & Emery LLP

(57) ABSTRACT

A common mode noise filter includes first to fourth insulator layers stacked in a stacking direction and first to third coils provided on the first to fourth insulator layers independently of one another. The first coil includes a first coil conductor provided on the first insulator layer and a second coil conductor provided on the fourth insulator layer and connected to the first coil conductor. The second coil is provided on the second insulator layer. The third coil is provided on the third insulator layer. The first coil conductor overlaps the second coil viewing from above. At least a part of the second coil overlaps at least a part of the third coil viewing from above. The second coil conductor overlaps the third coil viewing from above.

9 Claims, 16 Drawing Sheets

(51) Int. Cl.
    *H03H 7/42* (2006.01)
    *H01F 17/00* (2006.01)
    *H03H 1/00* (2006.01)
(52) U.S. Cl.
    CPC .............. *H01F 2017/0093* (2013.01); *H03H 2001/0085* (2013.01)
(58) Field of Classification Search
    USPC .................................................. 333/181, 185
    See application file for complete search history.

(56) References Cited

U.S. PATENT DOCUMENTS

| | | |
|---|---|---|
| 2003/0137384 A1 | 7/2003 | Itou et al. |
| 2013/0169399 A1 | 7/2013 | Yoo et al. |

FOREIGN PATENT DOCUMENTS

| | | |
|---|---|---|
| JP | 2003-217932 | 7/2003 |
| JP | 2007-150209 | 6/2007 |
| JP | 2013-140927 | 7/2013 |
| JP | 2014-123643 | 7/2014 |

PRIOR ART  FIG. 14

COMMON MODE NOISE FILTER

This application is a U.S. national stage application of the PCT international application No. PCT/JP2015/006063 filed on Dec. 7, 2015, which claims the benefit of foreign priority of Japanese patent application No. 2015-078183 filed on Apr. 7, 2015, the contents all of which are incorporated herein by reference.

TECHNICAL FIELD

The present invention relates to a small, thin common mode noise filter used in various electronic devices, such as digital devices, audio/visual devices, and information communication terminals.

BACKGROUND ART

The mobile industry processor interface (mipi) D-PHY standard has been adopted as a digital data transmission standard for connecting a main integrated circuit (IC) in a mobile device to a display, a camera, or the like, and a differential signaling system using two transmission lines has been used. In recent years, a camera resolution has increased dramatically, and a higher-speed transmission system, namely, the mipi C-PHY standard was established and has been in practical use which is a differential output system in which three transmission lines are used so that different voltages are transmitted from a transmitter side to the transmission lines and a difference between the lines is calculated on a receiver side.

FIG. 14 is an exploded perspective view of conventional common mode noise filter 500. Common mode noise filter 500 includes insulator layers 1 and three independent coils 2 to 4. Coils 2 to 4 are formed by electrically connecting coil conductors 2a and 2b, by electrically connecting coil conductors 3a and 3b, and by electrically connecting coil conductors 4a and 4b, respectively. Three coils 2 to 4 are disposed in this order from bottom in a stacking direction. In such a configuration, when common mode noise is input, magnetic fields generated at coils 2 to 4 enhance each other, and coils 2 to 4 operate as inductors to suppress noise.

A conventional common mode noise filter similar to common mode noise filter 500 is disclosed in, e.g. PTL 1.

CITATION LIST

Patent Literature

PTL 1: Japanese Patent Laid-Open Publication No. 2003-077727

SUMMARY

A common mode noise filter includes first to fourth insulator layers stacked in a stacking direction and first to third coils provided on the first to fourth insulator layers independently of one another. The first coil includes a first coil conductor provided on the first insulator layer and a second coil conductor provided on the fourth insulator layer and connected to the first coil conductor. The second coil is provided on the second insulator layer. The third coil is provided on the third insulator layer. The first coil conductor overlaps the second coil viewing from above. At least a part of the second coil overlaps at least a part of the third coil viewing from above. The second coil conductor overlaps the third coil viewing from above.

This common mode noise filter provides balanced magnetic coupling of the three coils and thus does not deteriorate differential signals.

DETAIL DESCRIPTION OF PREFERRED EMBODIMENTS

Figure 14:
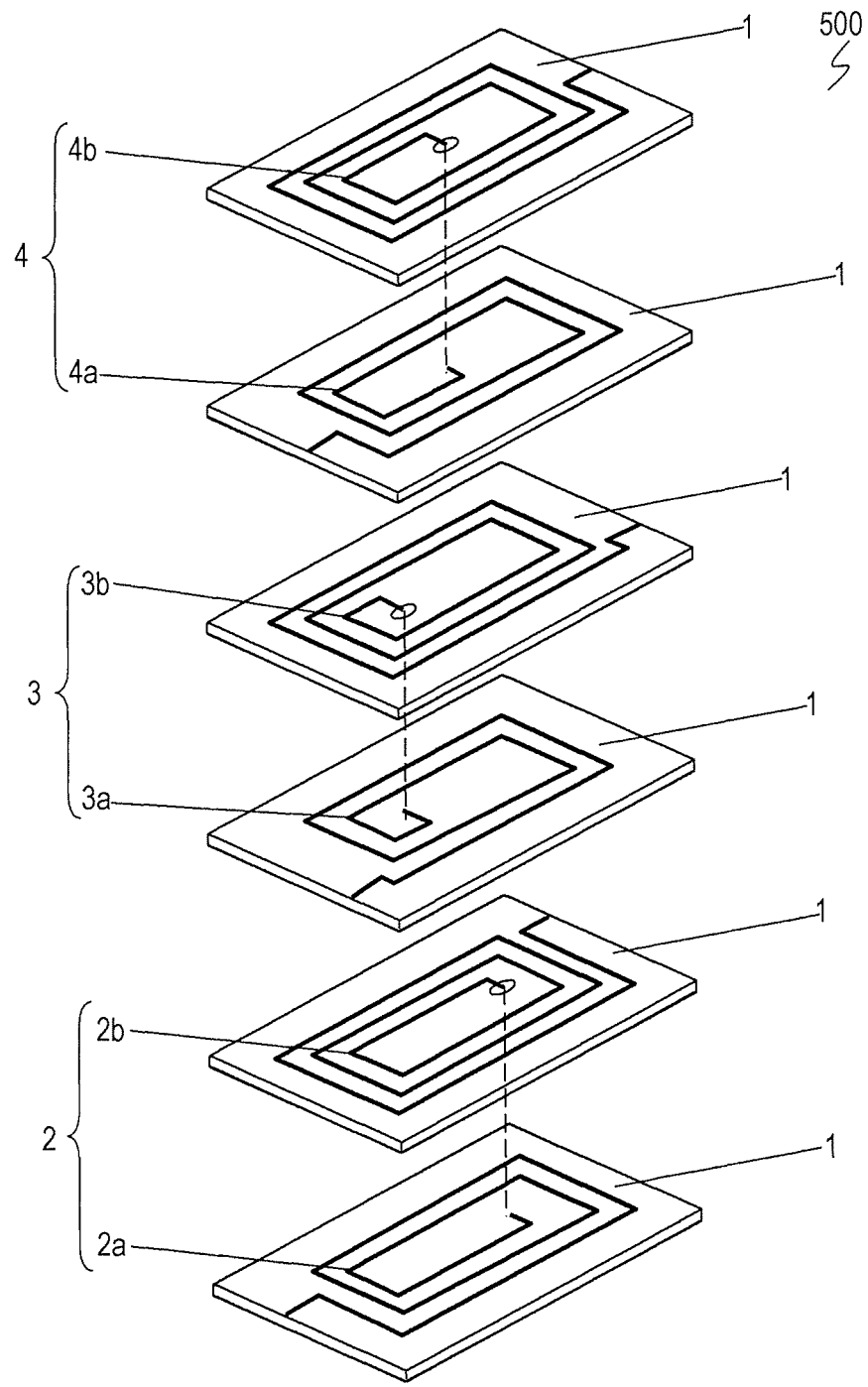
FIG. 14 is an exploded perspective view of a conventional common mode noise filter.

Before description of exemplary embodiments, a problem with conventional common mode noise filter 500 illustrated in FIG. 14 will be described.

In conventional common mode noise filter 500, coil 3 is disposed between coil 2 and coil 4, and thus the distance between coil 2 and coil 4 is large, hardly causing magnetic coupling of coil 2 and coil 4.

When such common mode noise filter 500 is applied to the aforementioned three-core differential signal line to transmit differential data signals, the magnetic fluxes generated at coil 2 and coil 4 which are not magnetically coupled to each other do not cancel each other out, and elements failing to be magnetically coupled causes high residual inductance, leading to a loss in the differential data signals and significant degradation of the quality of differential signals.

Figure 15:
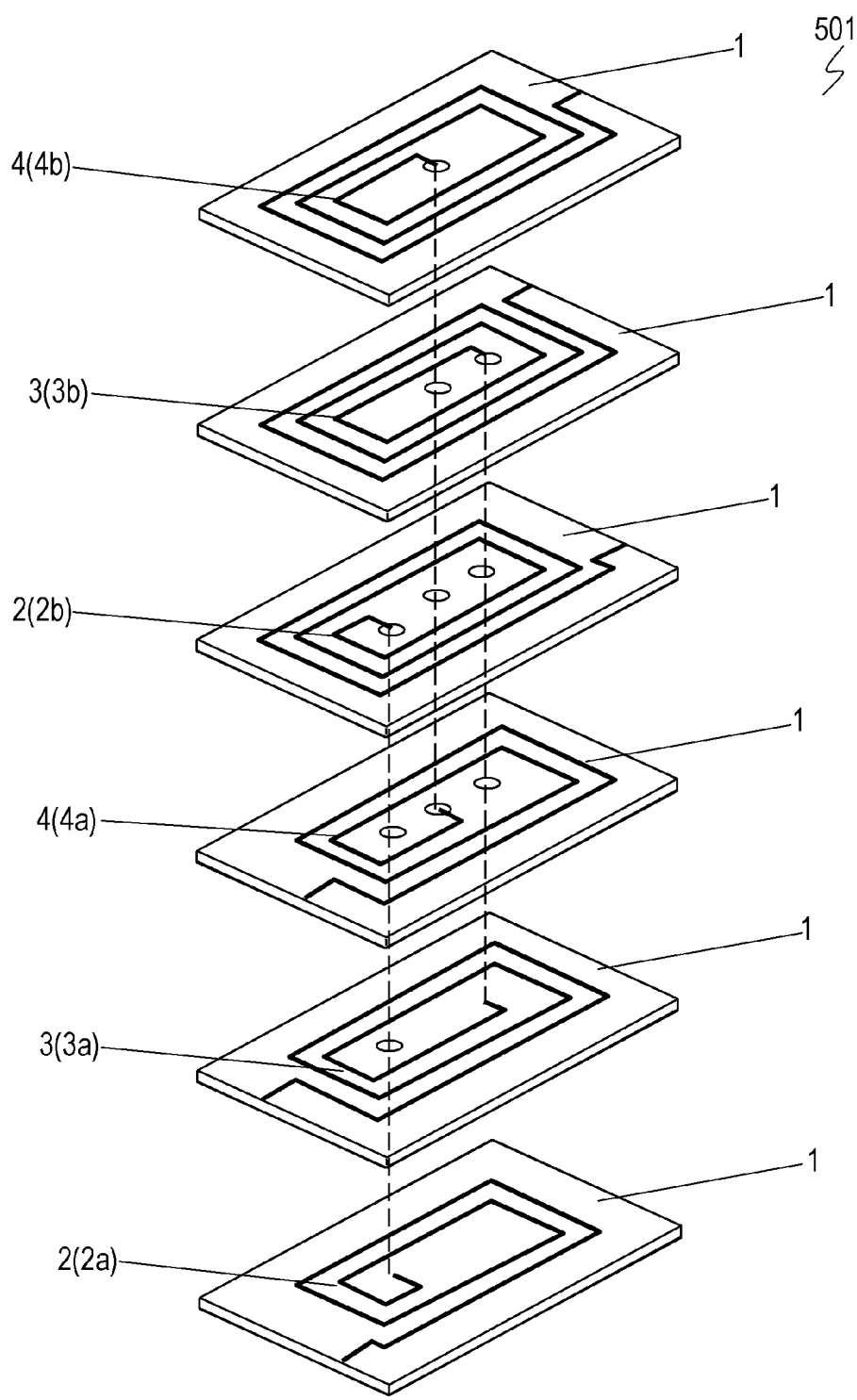
FIG. 15 is an exploded perspective view of a comparative example of a common mode noise filter.

FIG. 15 is an exploded perspective view of a comparative example of common mode noise filter 501. In common mode noise filter 501 illustrated in FIG. 15, coil conductor 2a constituting coil 2, coil conductor 3a constituting coil 3, coil conductor 4a constituting coil 4, coil conductor 2b constituting coil 2, coil conductor 3b constituting coil 3, and coil conductor 4b constituting coil 4 are stacked in this order so that coil 2 and coil 3 are adjacent to each other in two places and coil 3 and coil 4 are adjacent to each other in two places to enhance the magnetic coupling.

However, in common mode noise filter 501, coil 3 is sandwiched between coil 2 and coil 4, and the distance between coil 2 and coil 4 is large, resulting in the magnetic coupling being weaker than other parts and the magnetic coupling between the coils being poorly balanced.

When differential signals are input to common mode noise filter 501, the differential signal does not deteriorate much due to preferable magnetic coupling of adjacent coil 2 and coil 4 by coil 3. Even this configuration, however, causes a deterioration in the differential signals flowing through coil 2 and coil 4 as well since the distance between coil conductor 2b and coil conductor 4b and the distance between coil conductor 4a and coil conductor 2a are large, resulting in weak magnetic coupling.

Common mode noise filter according to exemplary embodiments which can cause balanced magnetic coupling of three coils and does not deteriorate differential signals will be described below with reference to drawings.

Exemplary Embodiment 1

Figure 1A:
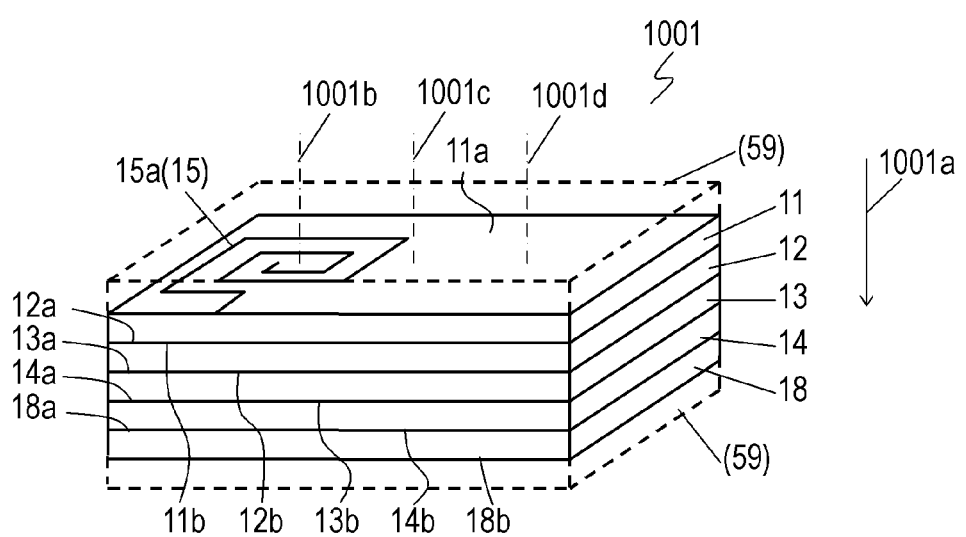
FIG. 1A is a perspective view of a common mode noise filter according to Exemplary Embodiment 1.
Figure 1B:
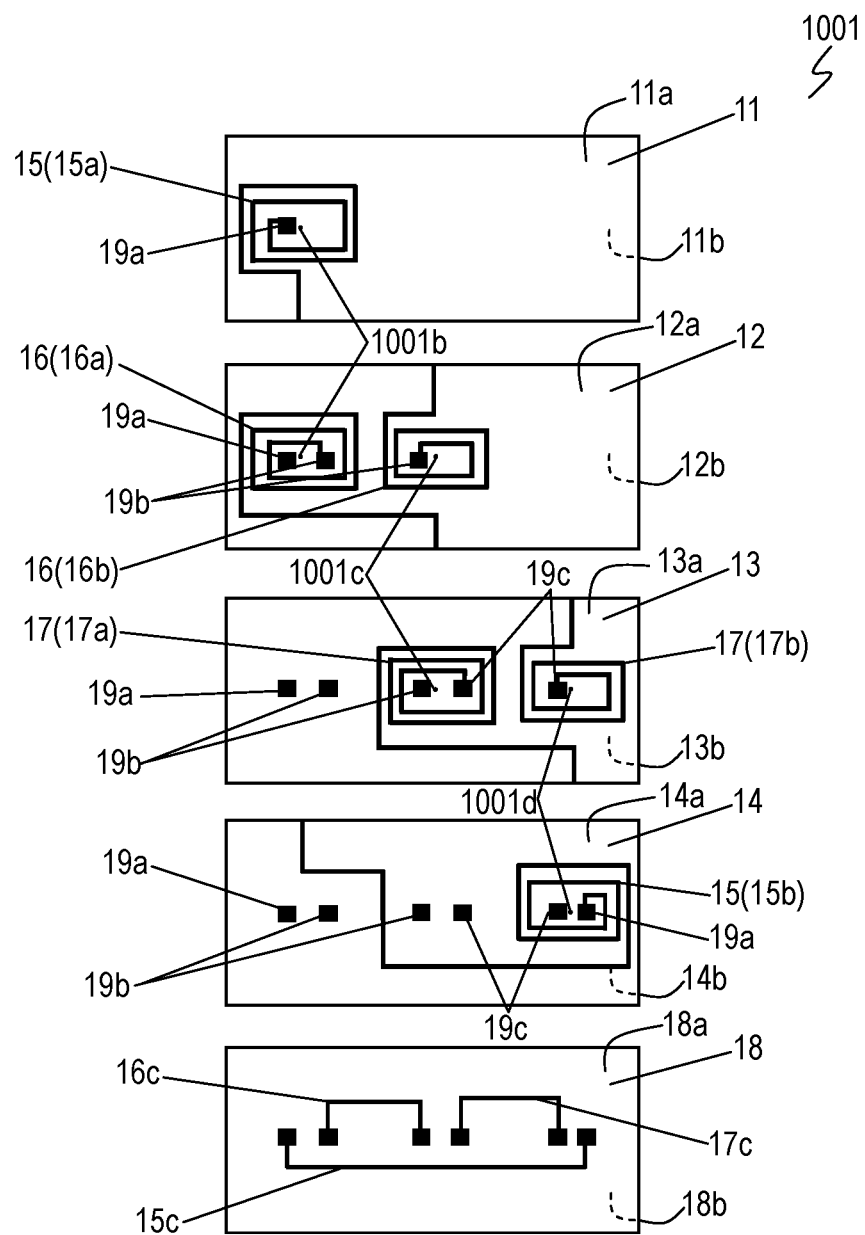
FIG. 1B is a top view of a main part of the common mode noise filter according to Embodiment 1.

FIG. 1A is a perspective view of common mode noise filter 1001 according to Exemplary Embodiment 1. FIG. 1B is a top view of a main part of common mode noise filter 1001. As illustrated in FIG. 1A and FIG. 1B, common mode noise filter 1001 according to Embodiment 1 includes: insulator layer 11, insulator layer 12, insulator layer 13, and insulator layer 14 stacked in this order from above in downward stacking direction 1001a, coil conductor 15a having a spiral shape provided on insulator layer 11, two coil conductors 16a and 16b having spiral shapes provided on insulator layer 12, two coil conductors 17a and 17b having spiral shapes provided on insulator layer 13, and coil conductor 15b having a spiral shape provided on insulator layer 14. Coil conductors 15a and 15b electrically connected to each other constitute coil 15. Coil conductors 16a and 16b electrically connected to each other constitute coil 16. Coil conductors 17a and 17b electrically connected to each other constitute coil 17. Coils 15, 16, and 17 are independent of one another.

Coil conductors 15a and 16a have spiral shapes winding about center axis 1001b extending in stacking direction 1001a. Coil conductors 16b and 17a have spiral shapes winding about center axis 1001c extending in stacking direction 1001a away from center axis 1001b. Center axis 1001c of the spiral shape of coil conductor 16b is located outside of the spiral shape of coil conductor 16a. Center axis 1001b of the spiral shape of coil conductor 16a is located outside of the spiral shape of coil conductor 16b. Coil conductors 15b and 17b have spiral shapes winding about center axis 1001d extending in stacking direction 1001a away from center axes 1001b and 1001c. Center axis 1001d of the spiral shape of coil conductor 17b is located outside of the spiral shape of coil conductor 17a. Center axis 1001c of the spiral shape of coil conductor 17a is located outside of the spiral shape of coil conductor 17b. Center axis 1001d of the spiral shape of coil conductor 15b is located outside of the spiral shape of coil conductor 15a. Center axis 1001b of the spiral shape of coil conductor 15a is located outside of the spiral shape of coil conductor 15b. Coil conductors 15a and 15b constituting coil 15 are connected in series to each other. Coil conductors 16a and 16b constituting coil 16 are connected in series to each other. Coil conductors 17a and 17b constituting coil 17 are connected in series to each other.

Insulator layer 11 has upper surface 11a and lower surface 11b. Insulator layer 12 has upper surface 12a and lower surface 12b. Insulator layer 13 has upper surface 13a and lower surface 13b. Insulator layer 14 has upper surface 14a and lower surface 14b. Upper surface 12a of insulator layer 12 is situated on lower surface 11b of insulator layer 11. Upper surface 13a of insulator layer 13 is situated on lower surface 12b of insulator layer 12. Upper surface 14a of insulator layer 14 is situated on lower surface 13b of insulator layer 13. Common mode noise filter 1001 further includes insulator layer 18. Insulator layer 18 has upper surface 18a and lower surface 18b. Upper surface 18a of insulator layer 18 is situated on lower surface 14b of insulator layer 14. Coil conductor 15a is provided on upper surface 11a of insulator layer 11. Coil conductors 16a and 16b are provided on upper surface 12a of insulator layer 12, i.e., lower surface 11b of insulator layer 11, and are provided between upper surface 12a of insulator layer 12 and lower surface 11b of insulator layer 11. Coil conductors 17a and 17b are provided on upper surface 13a of insulator layer 13, i.e., lower surface 12b of insulator layer 12, and are provided between upper surface 13a of insulator layer 13 and lower surface 12b of insulator layer 12. Coil conductor 15b is provided on upper surface 14a of insulator layer 14, i.e., lower surface 13b of insulator layer 13, and is provided between upper surface 14a of insulator layer 14 and lower surface 13b of insulator layer 13.

FIG. 1B illustrates upper surfaces 11a to 14a of insulator layers 11 to 14 having the coil conductors provided thereon.

Insulator layers 11 to 14 have substantially the same thickness and are made of Cu—Zn ferrite, non-magnetic material, such as a glass ceramic, or magnetic material, such as Ni—Cu—Zn ferrite, which having a sheet shape. Insulator layers 11 to 14 are stacked on one another so that insulator layer 12 is located below insulator layer 11, insulator layer 13 is located below insulator layer 12, and insulator layer 14 is located below insulator layer 13.

Coil conductor 15a is provided on insulator layer 11. Coil conductors 16a and 16b are provided on insulator layer 12. Coil conductors 17a and 17b are provided on insulator layer 13. Coil conductor 15b is provided on insulator layer 14. Coil conductors 15a, 15b, 16a, 16b, 17a, and 17b are formed by plating or printing electrically conductive materials, such as silver, to have the spiral shapes on insulator layers 11 to 14. The number of turns of each of these spiral coil conductors may be less than one or may be equal to or greater than one.

Coil conductor 15a provided on insulator layer 11 faces one coil conductor 16a out of coil conductors 16a and 16b provided on insulator layer 12 across insulator layer 11 to be magnetically coupled with one coil conductor 16a out of two coil conductors 16a and 16b, and overlaps one coil conductor 16a out of two coil conductors 16a and 16b viewing from above. Another coil conductor 16b out of two coil conductors 16a and 16b provided on insulator layer 12 faces one coil conductor 17a out of two coil conductors 17a and 17b provided on insulator layer 13 across insulator layer 12 to be magnetically coupled with one coil conductor 17a out of two coil conductors 17a and 17b, and overlaps one coil conductor 17a out of two coil conductors 17a and 17b viewing from above. Another coil conductor 17b out of two coil conductors 17a and 17b provided on insulator layer 13 faces coil conductor 15b provided on insulator layer 14 across insulator layer 13 to be magnetically coupled with coil conductor 15b, and overlaps coil conductor 15b viewing from above. Coil conductor 15a and coil conductor 16b do not overlap each other viewing from above and are not magnetically coupled with each other. Coil conductor 16a and coil conductor 17a do not overlap each other viewing from above and are not magnetically coupled with each other. Coil conductor 16b and coil conductor 17b do not overlap each other viewing from above and are not magnetically coupled with each other. Coil conductor 17a and coil conductor 15b do not overlap each other viewing from above and are not magnetically coupled with each other. Coil conductor 15a thus overlaps coil 16 viewing from above. At least a part of coil 16 overlaps at least a part of coil 17 viewing from above. Coil conductor 15b overlaps coil 17 viewing from above.

Coil 15 includes coil conductor 15a and coil conductor 15b. Coil 16 includes coil conductors 16a and 16b provided on single insulator layer 12. Coil 17 includes coil conductors 17a and 17b provided on single insulator layer 13.

Insulator layer 18 is located below insulator layer 14. Coil conductor 15a and coil conductor 15b constituting coil 15 are electrically connected to each other through via-electrodes 19a provided in insulator layers 11 to 14 and wiring conductor 15c provided on upper surface 18a of insulator layer 18.

Coil conductors 16a and 16b constituting coil 16 are electrically connected to each other through via-electrodes 19b provided in insulator layers 12 to 14 and wiring conductor 16c provided on insulator layer 18.

Coil conductors 17a and 17b constituting coil 17 are electrically connected to each other through via-electrodes 19c provided in insulator layers 13 and 14 and wiring conductor 17c provided on upper surface 18a of insulator layer 18.

This configuration provides three coils 15, 16, and 17 independent of one another. Coil 15 and coil 16 are magnetically coupled with each other in one place. Coil 16 and coil 17 are magnetically coupled with each other in one place. Coil 17 and coil 15 are magnetically coupled with each other in one place.

Wiring conductors 15c, 16c, and 17c constitute parts of coils 15, 16, and 17, respectively.

As illustrated in FIG. 1A, another insulator layer 59 may be stacked on upper surfaces 11a to 14a and 18a or on lower surfaces 11b to 14b and 18b of insulator layers 11 to 14 and 18 as needed, and these layers provide a laminated body. Furthermore, six external electrodes connected to respective end portions of coil conductors 15a, 15b, 16a, 16b, 17a, and 17b are provided on both edge surfaces of the laminated body.

Insulator layer 59 and insulator layers 11 to 14 and 18 may be made of non-magnetic material or may be made of magnetic material. Alternatively, at least one of insulator layer 59 and insulator layers 11 to 14 and 18 may be made of non-magnetic material and the other thereof may be made of magnetic material.

As described above, in common mode noise filter 1001 according to Embodiment 1, coil conductor 15a constituting coil 15 overlaps one coil conductor 16a out of the coil conductors constituting coil 16 in one place viewing from above. Another coil conductor 16b out of the coil conductors constituting coil 16 overlaps one coil conductor 17a out of the coil conductors constituting coil 17 in one place viewing from above. Another coil conductor 17b out of the coil conductors constituting coil 17 overlaps coil conductor 15b constituting coil 15 in one place viewing from above. Three coils 15 to 17 can thus be magnetically coupled with one another similarly to one another.

Only two coil conductors 16a and 16b constituting coil 16 are located on a single plane, upper surface 12a, of insulator layer 12 while only two coil conductors 17a and 17b constituting coil 17 are located on a single plane, upper surface 13a, of insulator layer 13. This configuration prevents magnetic coupling in a lateral direction parallel to the above planes.

Since each of coil 15, coil 16, and coil 17 includes two coil conductors, three coils 15, 16, and 17 can have substantially the same length.

In this case, the lengths of three coils 15, 16, and 17 may be substantially identical to one another by adjusting the lengths of wiring conductors 15c, 16c, and 17c.

Two coils out of three coils 15, 16, and 17 overlap each other only in one place viewing from above, and therefore, reduces stray capacitances among coils 15, 16, and 17.

As described above, common mode noise filter 1001 according to Embodiment 1 includes insulator layers 11, 12, 13, and 14 stacked on one another in this order from above in stacking direction 1001a, and coils 15, 16, and 17 which are provided on insulator layers 11, 12, 13, and 14 and are independent of one another. Coil 15 includes coil conductor 15a provided on insulator layer 11 and coil conductor 15b which is connected to coil conductor 15a and which is provided on insulator layer 14. Coil 16 is provided on insulator layer 12. Coil 17 is provided on insulator layer 13. Coil conductor 15a overlaps coil 16 viewing from above. At least a part of coil 16 overlaps at least a part of coil 17 viewing from above. Coil conductor 15b overlaps coil 17 viewing from above.

Coil 16 includes coil conductor 16a provided on insulator layer 12 and coil conductor 16b which is connected to coil conductor 16a and which is provided on insulator layer 12. Coil 17 includes coil conductor 17a provided on insulator layer 13 and coil conductor 17b which is connected to coil conductor 17a and which is provided on insulator layer 13. Coil conductor 15a overlaps coil conductor 16a of coil 16 viewing from above. Coil conductor 17a overlaps coil conductor 16b viewing from above. Coil conductor 17b overlaps coil conductor 15b viewing from above.

Exemplary Embodiment 2

Figure 2A:
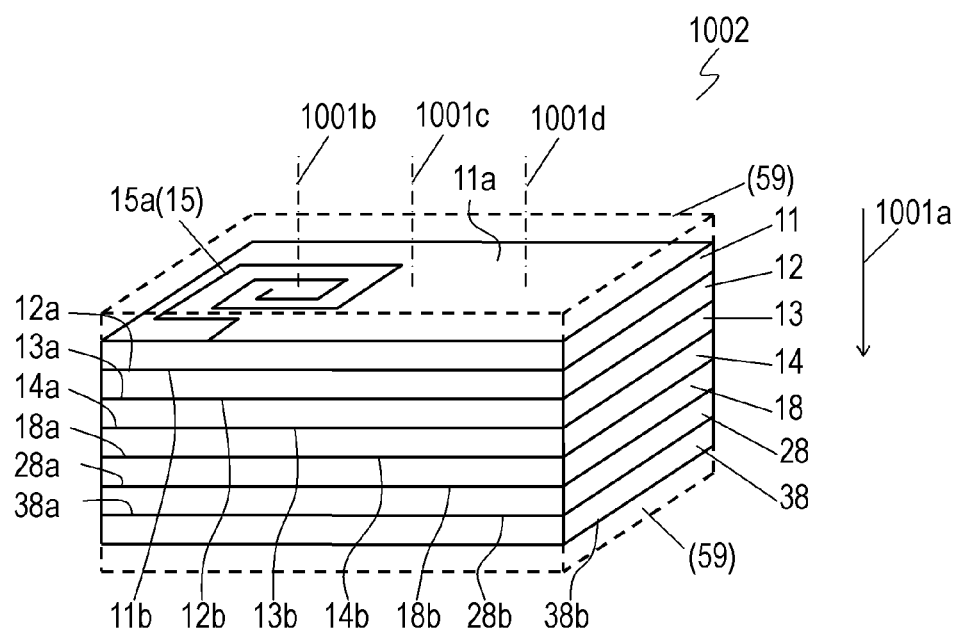
FIG. 2A is a perspective view of a common mode noise filter according to Exemplary Embodiment 2.
Figure 2B:
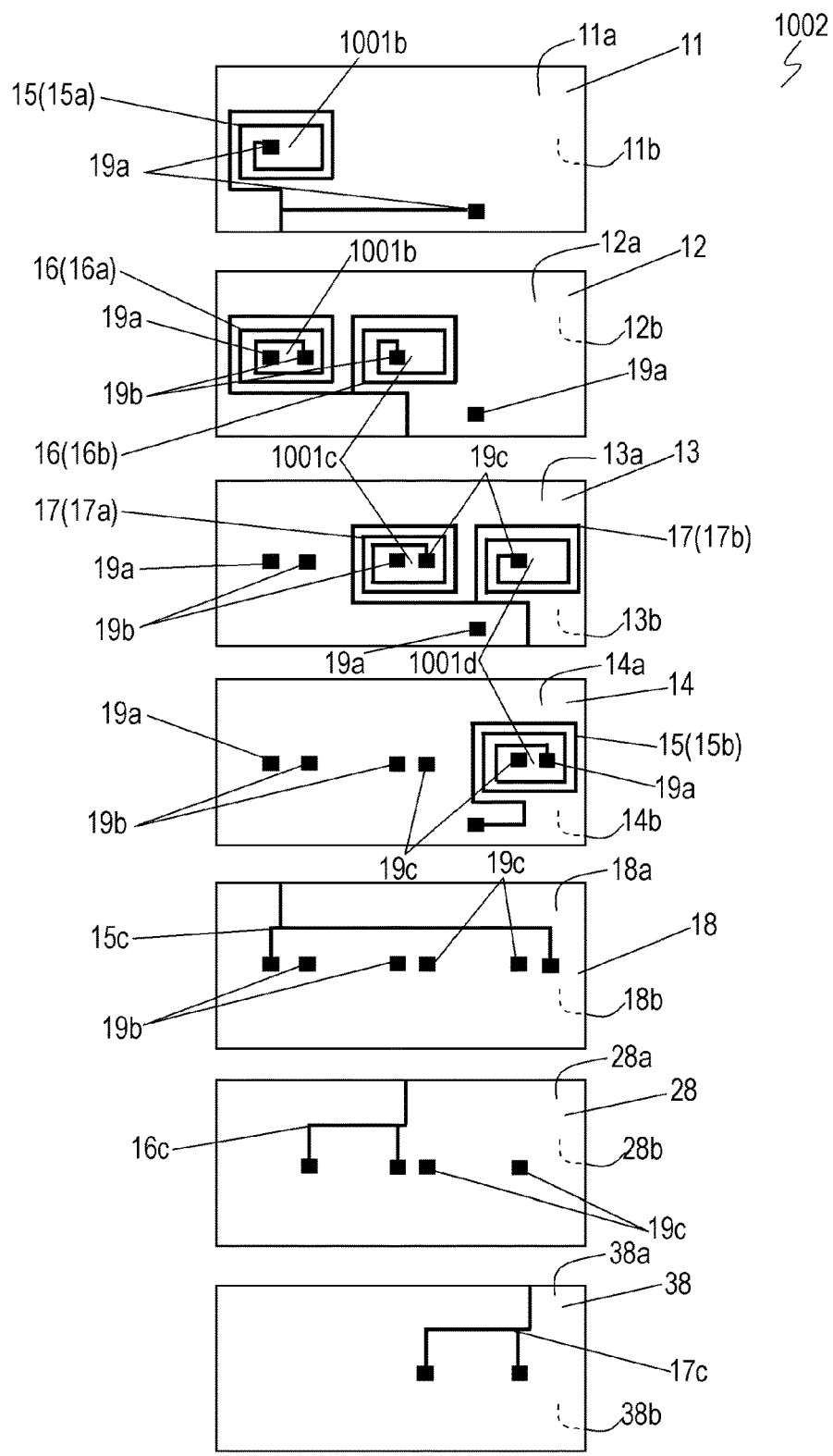
FIG. 2B is a top view of a main part of the common mode noise filter according to Embodiment 2.
Figure 3:
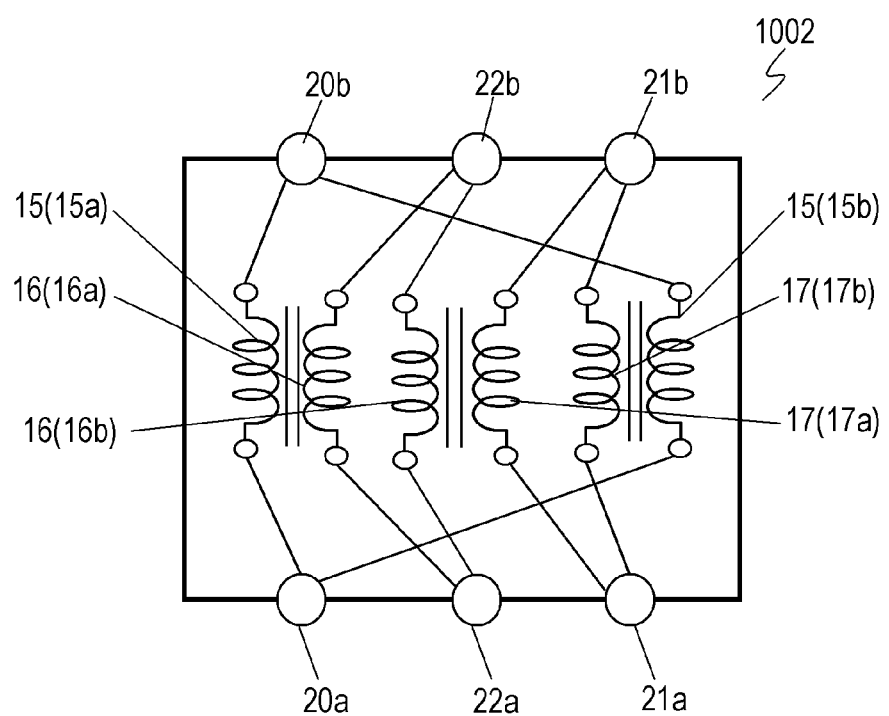
FIG. 3 is a circuit diagram of the common mode noise filter according to Embodiment 2.

FIG. 2A is a perspective view of common mode noise filter 1002 according to Exemplary Embodiment 2. FIG. 2B is a top view of a main part of common mode noise filter 1002. FIG. 3 is a circuit diagram of common mode noise filter 1002. In FIGS. 2A to 3, components identical to those of common mode noise filter 1001 according to Embodiment 1 illustrated in FIG. 1A and FIG. 1B are denoted by the same reference numerals. Common mode noise filter 1002 further includes insulator layer 28 provided below insulator layer 18 of common mode noise filter 1001 according to Embodiment 1 illustrated in FIG. 1A and FIG. 1B and insulator layer 38 provided below insulator layer 28. Insulator layer 28 has upper surface 28a and lower surface 28b. Insulator layer 38 has upper surface 38a and lower surface 38b. In accordance with Embodiment 2, upper surface 28a of insulator layer 28 is situated on lower surface 18b of insulator layer 18. Upper surface 38a of insulator layer 38 is situated on lower surface 28b of insulator layer 28.

In common mode noise filter 1002 according to Embodiment 2, as illustrated in FIG. 2B and FIG. 3, coil conductors 15a and 15b constituting coil 15 are connected in parallel with each other and connected to external electrodes 20a and 20b, respectively. Coil conductors 16a and 16b constituting coil 16 are connected in parallel with each other and connected to external electrodes 22a and 22b, respectively. Coil conductors 17a and 17b constituting coil 17 are connected in parallel with each other and connected to external electrodes 21a and 21b, respectively.

One coil conductor 15a out of the coil conductors constituting coil 15 overlaps one coil conductor 16a out of the coil conductors constituting coil 16 viewing from above. Another coil conductor 16b out of the coil conductors constituting coil 16 overlaps one coil conductor 17a out of the coil conductors constituting coil 17 viewing from above. Another coil conductor 17b out of the coil conductors constituting coil 17 overlaps another coil conductor 15b out of the coil conductors constituting coil 15 viewing from above. Three coils 15 to 17 can thus be magnetically coupled with one another with a preferable balanced.

An operation of common mode noise filter 1002 applied to a three-differential signal line will be described below. When differential signals with phases opposite to each other are input to coils 15 and 16 from external electrodes 20a and 22a, coil conductor 15a is magnetically coupled with coil conductor 16a, and magnetic fluxes generated at coil conductors 15a and 16a due to the differential signals cancel out each other, resulting in coil conductors 15a and 16a having low impedance for the differential signals to allow the differential signals to pass through the coils. In the meantime, a signal that cancels out the magnetic flux generated at coil conductor 15b due to the differential signals does not flow through coil conductor 17b which faces and overlaps, viewing from above, coil conductor 15b connected in parallel with coil conductor 15a and is magnetically coupled with coil conductor 15b, and therefore coil conductor 15b operates as an inductor having higher impedance with an increase in the frequency of a signal, preventing the differential signals from flowing through coil conductor 15b.

When differential signals with opposite phases are input to coil 15 and coil 17 from external electrodes 20a and 21a, coil conductor 15b and coil conductor 17b are magnetically coupled, and the magnetic fluxes generated at coil conductors 15b and 17b due to the differential signals cancel out each other out, resulting in coil conductors 15b and 17b having low impedance for the differential signals to allow the differential signals to pass through the coil conductors. In the meantime, a signal that cancels out the magnetic flux generated at coil conductor 15a due to the differential signals does not flow through coil conductor 16a which faces and overlaps, viewing from above, coil conductor 15a connected in parallel with coil conductor 15b and is magnetically coupled with coil conductor 15a, and therefore coil conductor 15a operates as an inductor and has higher impedance with an increase in the frequency of a signal, preventing the signals from flowing through coil conductor 15a.

In other words, even when coil conductor 15a and coil conductor 15b constituting coil 15 through which one of the differential signals flows are connected in parallel, the main path through which the differential signals flow is determined to be coil conductor 15a or coil conductor 15b depending on which one of coil 16 and coil 17 becomes another line through which the other of the differential signals flows, and thus the loss in the differential signals can be reduced. This configuration allows coils 15 to 17 to be magnetically coupled with a preferable balanced. Even when common mode noise filter 1002 is used as a three-differential signal line, the quality of signals can be maintained with a small loss in the differential signals.

Two coil conductors 15a and 15b constituting coil 15 are connected in parallel to each other. Two coil conductors 16a and 16b constituting coil 16 are connected in parallel to each other. Two coil conductors 17a and 17b constituting coil 17 are connected in parallel to each other. Therefore, coils 15 to 17 have small direct-current resistances (components at a frequency of zero) of coils 15 to 17, preventing a loss in the signals flowing through coils 15 to 17.

Exemplary Embodiment 3

Figure 4:
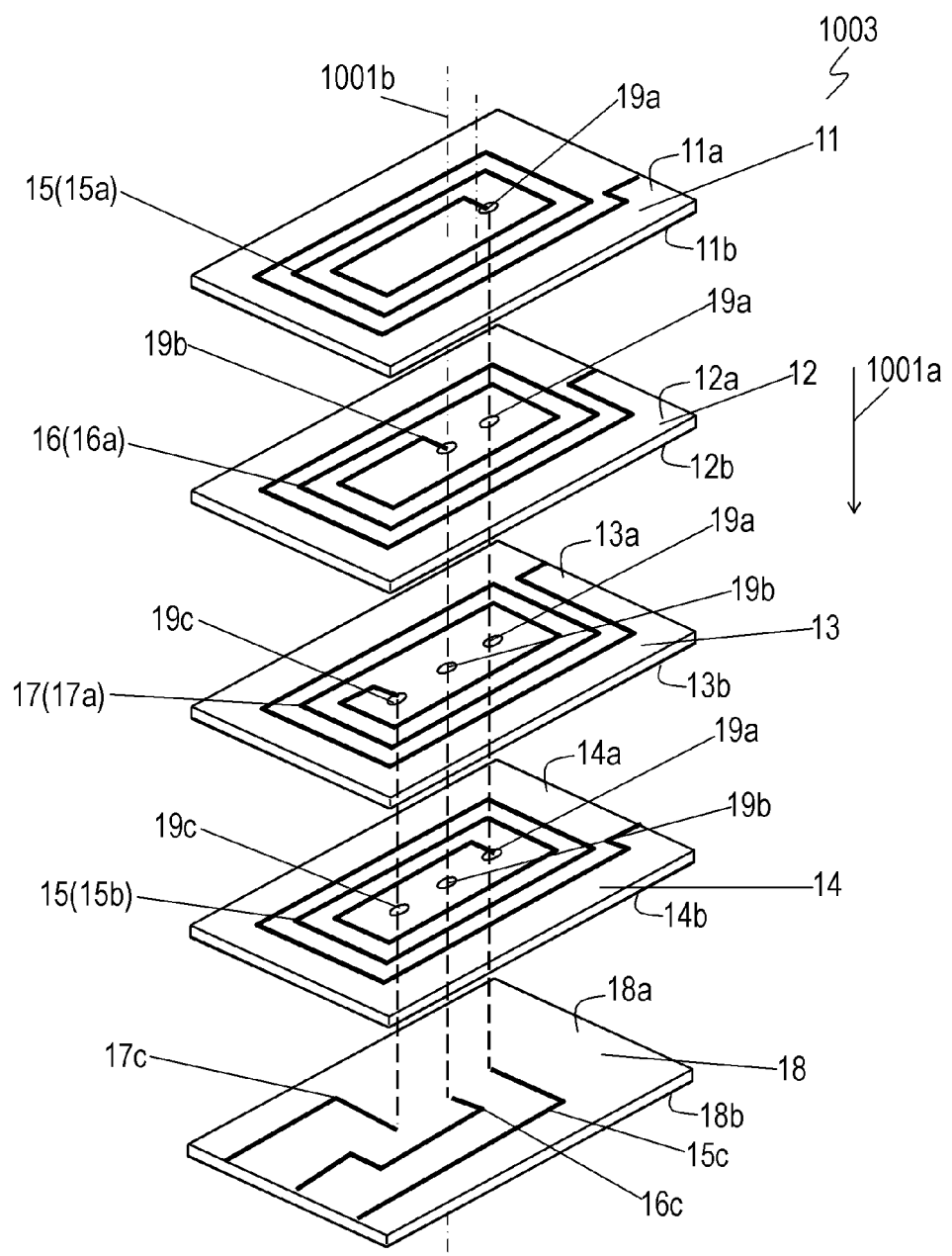
FIG. 4 is an exploded perspective view of a common mode noise filter according to Exemplary Embodiment 3.
Figure 5:
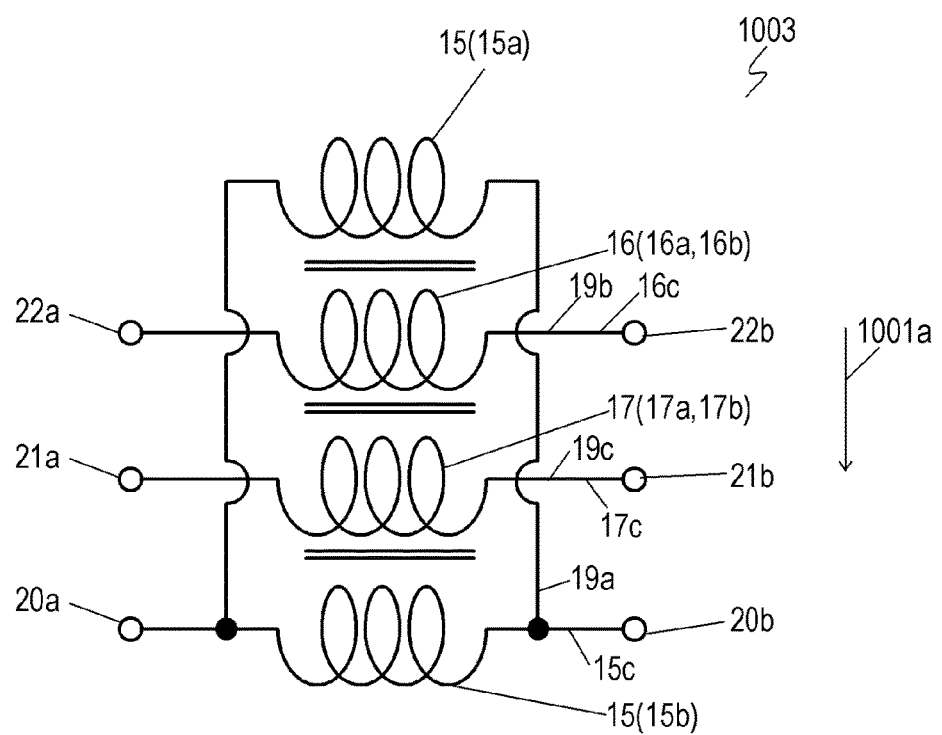
FIG. 5 is a circuit diagram of the common mode noise filter according to Embodiment 3.

FIG. 4 is an exploded perspective view of common mode noise filter 1003 according to Exemplary Embodiment 3. FIG. 5 is a circuit diagram of common mode noise filter 1003. In FIG. 4 and FIG. 5, components identical to those of common mode noise filter 1001 according to Embodiment 1 illustrated in FIG. 1A and FIG. 1B are denoted by the same reference numerals.

The common mode noise filter according to Embodiment 3 includes insulator layers 11 to 14 and 18 and coil conductors 15a, 15b, 16a, and 17a having spiral shapes. As illustrated in FIG. 4, insulator layers 11 to 18 are stacked on one another in this order from above in downward stacking direction 1001a. Coil conductor 15a is provided on insulator layer 11. Coil conductor 16a is provided on insulator layer 12. Coil conductor 17a is provided on insulator layer 13. Coil conductor 15b is provided on insulator layer 14. Coil conductor 16a constitutes coil 16. Coil conductor 17a constitutes coil 17. Coil conductor 15a and coil conductor 15b are electrically connected to constitute coil 15. Coils 15, 16, and 17 are independent of one another.

Coil conductors 15a, 15b, 16a, and 17a have spiral shapes extending about center axis 1001b extending in stacking direction 1001a. Coil conductors 15a and 15b constituting coil 15 are connected in parallel with each other.

Insulator layers 11 to 14 have substantially the same thickness and are made of a Cu—Zn ferrite, a non-magnetic material such as a glass ceramic, or a magnetic material such as an Ni—Cu—Zn ferrite which is formed in the shape of a sheet. Insulator layers 11 to 14 are stacked such that insulator layer 12 is located below insulator layer 11, insulator layer 13 is located below insulator layer 12, and insulator layer 14 is located below insulator layer 13.

Single coil conductor 15a is provided on insulator layer 11. Single coil conductor 16a is provided on insulator layer 12. Single coil conductor 17a is provided on insulator layer 13. Single coil conductor 15b is provided on insulator layer 14.

In other words, only coil 15 among coils 15 to 17 is divided to coil conductors 15a and 15b connected in parallel to each other. One coil conductor 15a out of the coil conductors is disposed above coil 16 (coil conductor 16a) while another coil conductor 15b out of the coil conductors is disposed below coil 17 (coil conductor 17a). Thus, coil 15 (coil conductor 15a), coil 16 (coil conductor 16a), coil 17 (coil conductor 17a), and coil 15 (coil conductor 15b) are located in this order from above.

Coil conductor 15a and coil conductor 16a adjacent to each other across insulator layer 11 in upward and down word directions (stacking direction 1001a) overlap each other viewing from above and face each other across insulator layer 11, hence being magnetically coupled with each other. Similarly, coil conductor 16a and coil conductor 17a adjacent to each other across insulator layer 12 in the upward and downward directions (stacking direction 1001a) overlap each other viewing from above and face each other across insulator layer 12, hence being magnetically coupled with each other. Coil conductor 17a and coil conductor 15b adjacent to each other across insulator layer 13 in the upward and downward directions (stacking direction 1001a) overlap each other viewing from above and face each other across insulator layer 13, hence being magnetically coupled with each other.

This configuration provides three independent coils 15, 16, and 17 such that coil 15 and coil 16 face each other and are magnetically coupled with each other, coil 16 and coil 17 face each other and are magnetically coupled with each other, and coil 17 and coil 15 face each other and are magnetically coupled with each other.

Coil conductors 15a, 16a, 17a, and 15b are formed by plating or printing electrically conductive material, such as silver, to have spiral shapes on insulator layers 11 to 14. The number of turns of each of these spiral coil conductors may be less than one or may be equal to or greater than one.

Wiring conductors 15c, 16c, and 17c used as leads connected to coil 15 (coil conductor 15a and coil conductor 15b), coil 16 (coil conductor 16a), and coil 17 (coil conductor 17a), respectively are provided on lower surface 14b of insulator layer 14. Insulator layer 18 is provided on the lower surfaces of wiring conductors 15c, 16c, and 17c. Wiring conductors 15c, 16c, and 17c are located on upper surface 18a of insulator layer 18.

Insulator layers 11 to 14 and 18 may be made of non-magnetic material or may be made of magnetic material. Alternatively, at least one of insulator layer 59 and insulator layers 11 to 14 and 18 may be made of non-magnetic material and the other insulator layers may be made of magnetic material.

Coil conductor 16a and wiring conductor 16c are connected through via-electrodes 19b. Coil conductor 17a and wiring conductor 17c are connected through via-electrodes 19c. Coil conductor 15a and coil conductor 15b are connected to wiring conductor 15c through via-electrodes 19a. Coil conductor 15a and coil conductor 15b are connected through via-electrodes 19a.

Further insulator layers may be stacked on upper surfaces 11a to 14a and 18a or lower surfaces 11b to 14b and 18b of insulator layers 11 to 14 and 18 as necessary. These layers provide a laminated body. Six external electrodes that connect respective one ends of coil conductors 15a, 16a, 17a, and 15b and respective one ends of wiring conductors 15c, 16c, and 17c are provided on both edge surfaces of this laminated body. The one end of coil conductor 15a and the one end of coil conductor 15b are connected to the same external electrode and are connected in parallel.

In common mode noise filter 1003 according to Embodiment 3 described above, unlike common mode noise filter 1002 according to Embodiment 2, coils 15 to 17 overlap one another viewing from above. Coil conductors 15a and 15b of coil 15 are connected in parallel with each other. Coils 16 and 17 are disposed between coil conductor 15a and coil conductor 15b. This configuration eliminates the need to divide coil 16 to two coil conductors 16a and 16b connected in parallel and to divide coil 17 to two coil conductors 17a and 17b connected in parallel as in Embodiment 2.

Specifically, when common mode noise filter 1003 operates in a three-differential signal line, coil 16 is magnetically coupled with coil 17 and also magnetically coupled with coil conductor 15a of coil 15 as in Embodiment 2 described above. Coil 17 is magnetically coupled with coil 16 and also magnetically coupled with coil conductor 15b of coil 15. When differential signals are input, coil 17 does not deteriorate the differential signals by operating as a low-loss differential transmission line.

Common mode noise filter 1003 according to Embodiment 3 can operate with a smaller number of insulator layers than common mode noise filter 1002 according to Embodiment 2, and can have a small size as a result of a single coil conductor disposed per insulator layer. Viewing from another perspective, in common mode noise filter 1003 according to Embodiment 3 which has the same area as common mode noise filter 1002 according to Embodiment 2, the number of turns of a coil can be large. Therefore, when common mode noise is input, the coil has high impedance with high inductance and thus can remove the common mode noise.

Although common mode noise filter 1003 according to Embodiment 3 includes four layers of coil conductors, the filter may have multiple stages through cascade connection of plural units each including such four layers of coil conductors stacked in stacking direction 1001a.

Exemplary Embodiment 4

Figure 6:
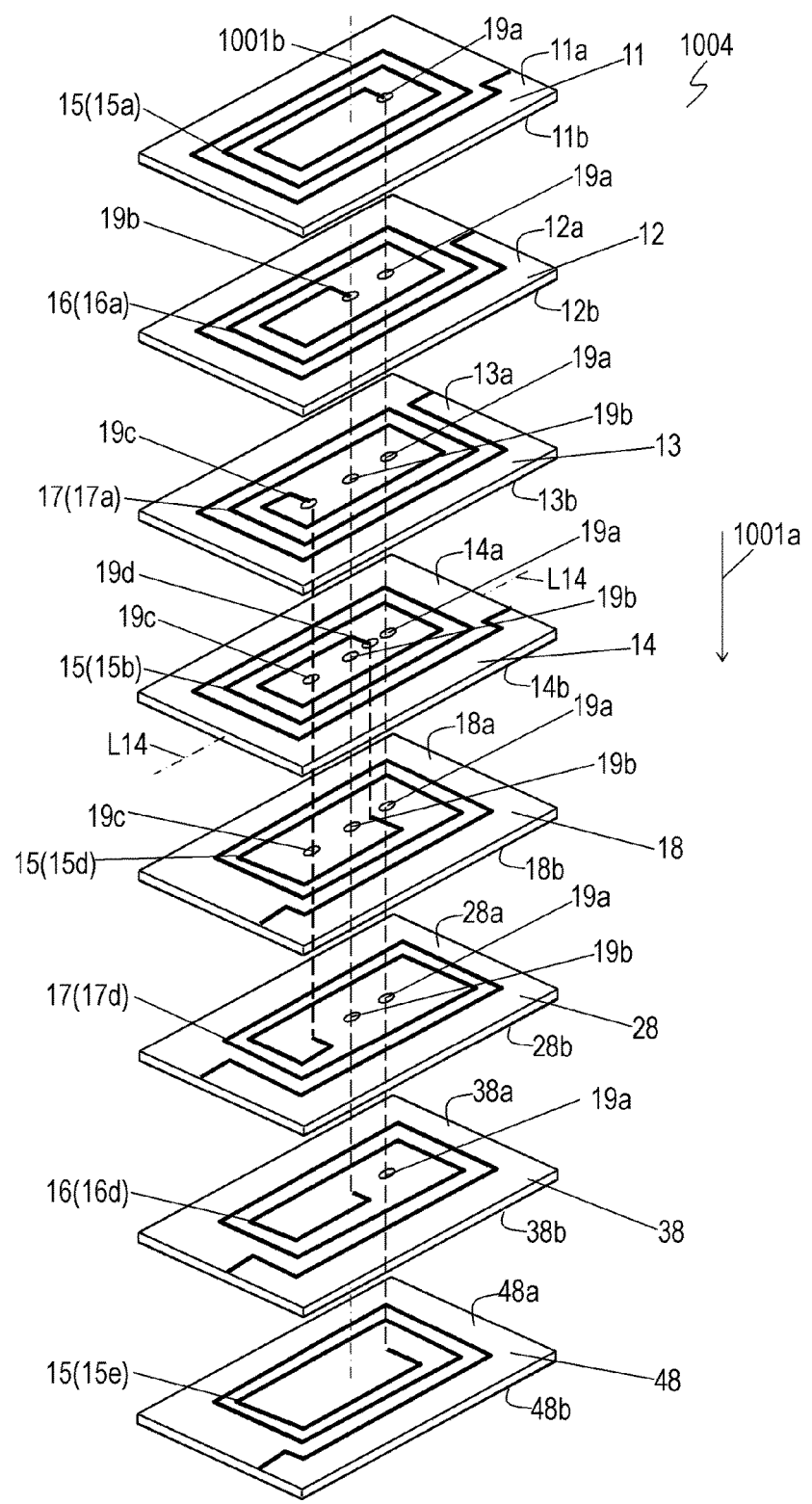
FIG. 6 is an exploded perspective view of a common mode noise filter according to Exemplary Embodiment 4.

FIG. 6 is an exploded perspective view of common mode noise filter 1004 according to Exemplary Embodiment 4. In FIG. 6, components identical to those of common mode noise filter 1003 according to Embodiment 3 illustrated in FIG. 4 and FIG. 5 are denoted by the same reference numerals.

Common mode noise filter 1004 according to Embodiment 4 does not include wiring conductors 15c, 16c, and 17c of common mode noise filter 1003 according to Embodiment 3. Coils 15, 16, and 17 according to Embodiment 3 are provided at positions of wiring conductors 15c, 16c, and 17c. Specifically, coil conductors (coil conductors 15d, 16d, 17d, and 15e) which have substantially the same configurations as coil conductors 15a, 16a, 17a, and 15b according to Embodiment 3 are provided below coil conductors 15a, 16a, 17a, and 15b.

Common mode noise filter 1004 further includes insulator layers 28, 38, and 48 stacked below insulator layer 18. Insulator layers 28, 38, and 48 have upper surfaces 28a, 38a, and 48a and lower surfaces 28b, 38b, and 48b, respectively. Insulator layer 28 is stacked on lower surface 18b of insulator layer 18. Insulator layer 38 is stacked on lower surface 28b of insulator layer 28. Insulator layer 48 is stacked on lower surface 38b of insulator layer 38. Upper surface 28a of insulator layer 28 is situated on lower surface 18b of insulator layer 18. Upper surface 38a of insulator layer 38 is situated on lower surface 28b of insulator layer 28. Upper surface 48a of insulator layer 48 is situated on lower surface 38b of insulator layer 38.

Coil conductor 15d is connected in parallel to coil conductor 15e of coil 15. Coil conductor 16d constituting coil 16 and coil conductor 17d constituting coil 17 are disposed between coil conductor 15d and coil conductor 15e. Coil conductor 15d and coil conductor 15b are adjacent to each other. Coil conductor 16d constituting coil 16 is located below coil conductor 17d constituting coil 17.

Coil conductor 15e is connected to coil conductor 15a through via-electrodes 19a. Coil conductor 16d is connected to coil conductor 16a through via-electrodes 19b. Coil conductor 17d is connected to coil conductor 17a through via-electrodes 19c.

Coil conductor 15d and coil conductor 15b adjacent to each other are connected to each other through via-electrode 19d.

Figure 7:
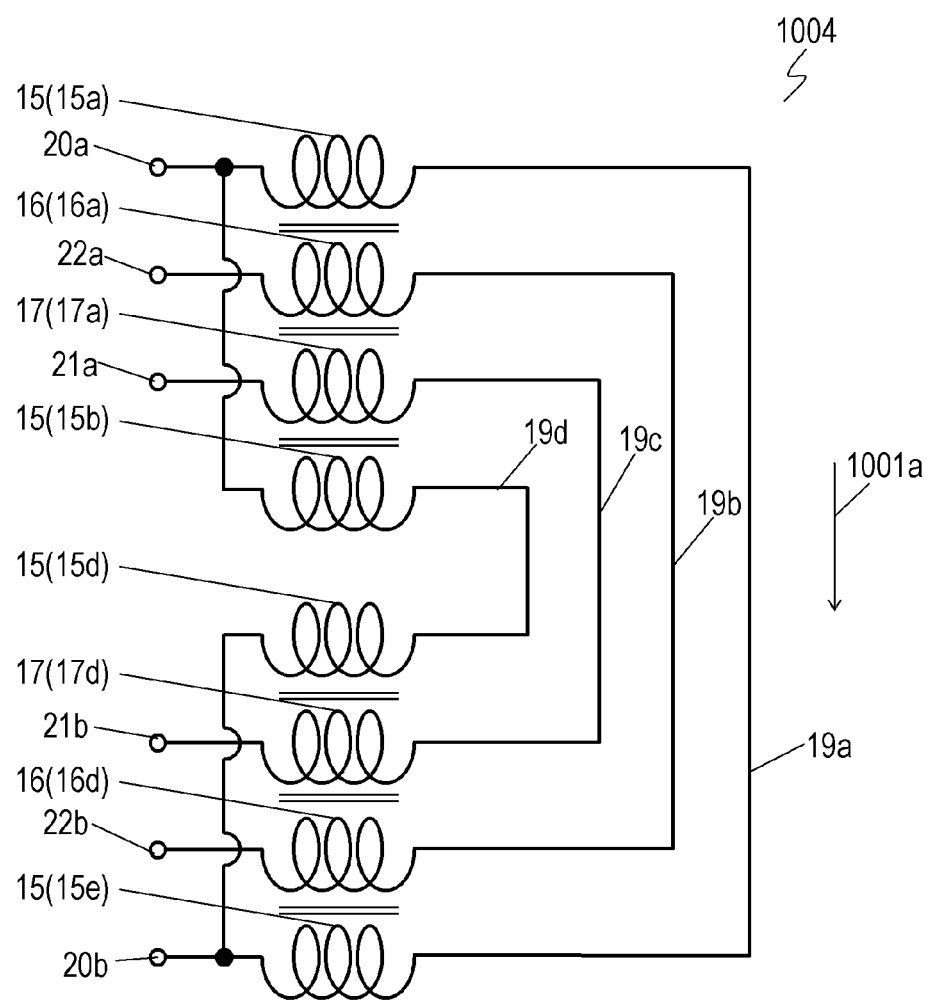
FIG. 7 is a circuit diagram of the common mode noise filter according to Embodiment 4.

In common mode noise filter 10004 according to Embodiment 4, two common mode noise filters 1003 according to Embodiment 3 are stacked on each other. FIG. 7 is a circuit diagram of common mode noise filter 1004.

Coil conductors 16a and 16d are connected in series to each other between external electrodes 22a and 22b so as to constitute coil 16. Coil conductors 17a and 17d are connected in series to each other between external electrodes 21a and 21b so as to constitute coil 17. Coil conductors 15a, 15b, 15d, and 15e are connected between external electrodes 20a and 20b so as to constitute coil 15. Coil conductors 15a and 15e are connected in series to each other between external electrodes 20a and 20b. Coil conductors 15b and 15d are connected in series to each other between external electrodes 20a and 20b. Coil conductors 15a, 15b, 15d, 15e, 16a, 16d, 17a, and 17d have spiral shapes winding about center axis 1001b.

Coil conductors 15a and 15e constituting coil 15 are located symmetrically to each other with respect to straight line L14 which is located at centers of insulator layers 11, 12, 13, 14, 18, 28, and 38 in stacking direction 1001a, which is parallel to upper surface 14a and lower surface 14b of insulator layer 14 located between coil conductor 15b and coil conductor 15d, and which passes through between upper surface 14a and lower surface 14b. Coil conductors 15b and 15d constituting coil 15 are symmetrical to each other with respect to straight line L14. Coil conductors 16a and 16d constituting coil 16 are symmetrical to each other with respect to straight line L14. Coil conductors 17a and 17d constituting coil 17 are symmetrical to each other with respect to straight line L14. In other words, coil conductors 17a and 17d constituting coil 17 are sandwiched between coil conductors 16a and 16d constituting coil 16. Coil conductors 15b and 15d constituting coil 15 and located at a center area in stacking direction 1001a are sandwiched between coil conductors 17a and 17d constituting coil 17.

In this configuration, coil conductors 15b and 15d have the same potential, reducing a stray capacitance between coil conductors 15b and 15d and reducing a deterioration of the differential signals passing through coil 15.

When differential signals with opposite phases are input to coils 15 and 17 serving as a three-core differential signal line, one of the differential signals passes through coil conductors 15a and 15d while the other of the differential signals passes through coil conductors 17a and 17d. At this moment, magnetic fields generated at coil conductors 17a and 15b due to the differential signals cancel out each other while magnetic fluxes generated at coil conductors 17d and 15d cancel out each other. Therefore, common mode noise filter 1004 has low impedance for the differential signals, and a difference does not easily occur in the potential between a set of paired conductors, namely, coil conductors 17a and 15b and a set of paired conductors, namely, coil conductors 17d and 15d. This configuration reduces a stray capacitance between one of each set of the paired conductors and the other set of the paired conductors. For these reasons, the deterioration of the differential signals is suppressed in common mode noise filter 1004. For example, if coil conductors 16d and 17d are replaced with each other, when differential signals are input to coils 15 and 17 serving as a three-core differential signal line, a differential signal component that cancels out the magnetic flux generated at coil conductor 15d does not flow through coil conductor 16d which faces coil conductor 15d. Therefore coil conductors 15d and 16d have large impedance for the differential signals, and a difference occurs in the potential between conductors 15d and 16d as an increase in the frequency, hence producing the stray capacitance and deteriorating the differential signals.

When common mode noise filter 1004 according to Embodiment 4 operates as a three-core differential signal line, the quality of signals can be maintained with a small loss in the differential signals as well due to the same function as in common mode noise filters 1002 and 1003 according to Embodiments 2 and 3 described above.

As described above, common mode noise filter 1004 further includes insulator layers 18, 28, 38, and 48 stacked in this order from above in stacking direction 1001a from insulator layer 14. Coil 16 includes coil conductor 16a provided on insulator layer 21 and coil conductor 16d connected to coil conductor 16a and provided on insulator layer 38. Coil 17 includes coil conductor 17a provided on insulator layer 13 and coil conductor 17d connected to coil conductor 17a and provided on insulator layer 28. Coil 15 includes coil conductor 15e connected to coil conductor 15a and provided on insulator layer 48 and coil conductor 15d connected to coil conductor 15b and provided on insulator layer 18. Coil conductor 15a of coil 15 and coil conductor 16a of coil 16 overlap each other viewing from above and face each other across insulator layer 11. Coil conductor 16a of coil 16 and coil conductor 17a of coil 17 overlap each other viewing from above and face each other across insulator layer 12. Coil conductor 15b of coil 15 and coil conductor 17a of coil 17 overlap each other viewing from above and face each other across insulator layer 13. Coil conductor 15e of coil 15 and coil conductor 16d of coil 16 overlap each other viewing from above and face each other across insulator layer 38. Coil conductor 16d of coil 16 and coil conductor 17d of coil 17 overlap each other viewing from above and face each other across insulator layer 28. Coil conductor 15d of coil 15 and coil conductor 17d of coil 17 overlap each other viewing from above and face each other across insulator layer 18.

Coil conductors 17a and 17d of coil 17 are located between coil conductors 16a and 16d of coil 16 in stacking direction 1001a.

Coil conductors 16a and 16d of coil 16 are connected in series to each other. Coil conductors 17a and 17d of coil 17 are connected in series to each other. Coil conductors 15a and 15e of coil 15 are connected in series to each other. Coil conductors 15b and 15d of coil 15 are connected in series to each other.

Figure 8:
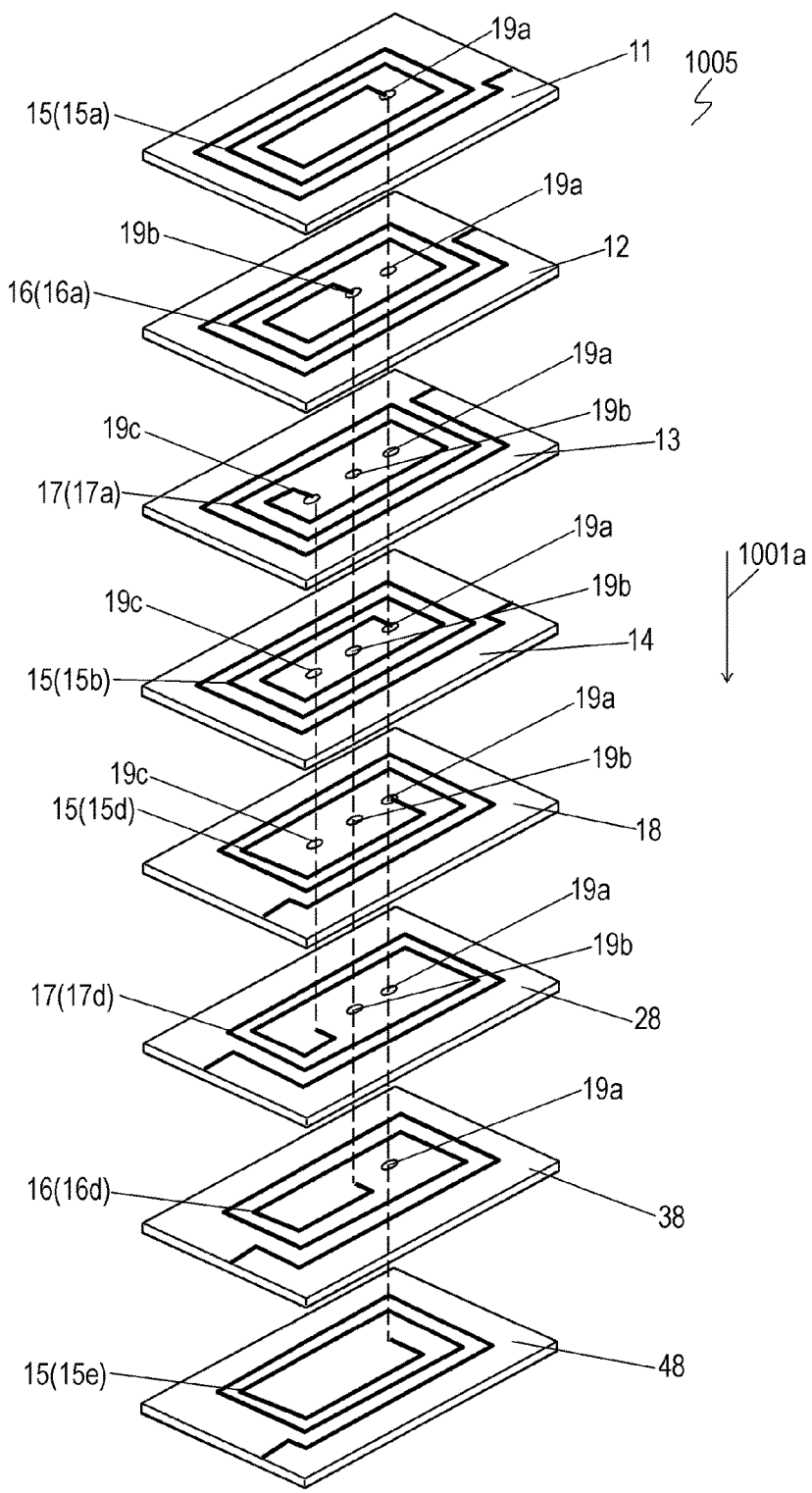
FIG. 8 is an exploded perspective view of another common mode noise filter according to Embodiment 4.

FIG. 8 is an exploded perspective view of another common mode noise filter 1005 according to Embodiment 4. In FIG. 8, components identical to those of common mode noise filter 1004 illustrated in FIG. 6 and FIG. 7 are denoted by the same reference numerals. In common mode noise filter 1005 illustrated in FIG. 8, coil conductor 15a and coil conductor 15b are connected in parallel to each other through via-electrodes 19a while coil conductor 15d and coil conductor 15e are connected in parallel to each other through via-electrodes 19a, allowing the number of via-electrodes to be less than that in common mode noise filter 1004 illustrated in FIG. 6.

Exemplary Embodiment 5

Figure 9:
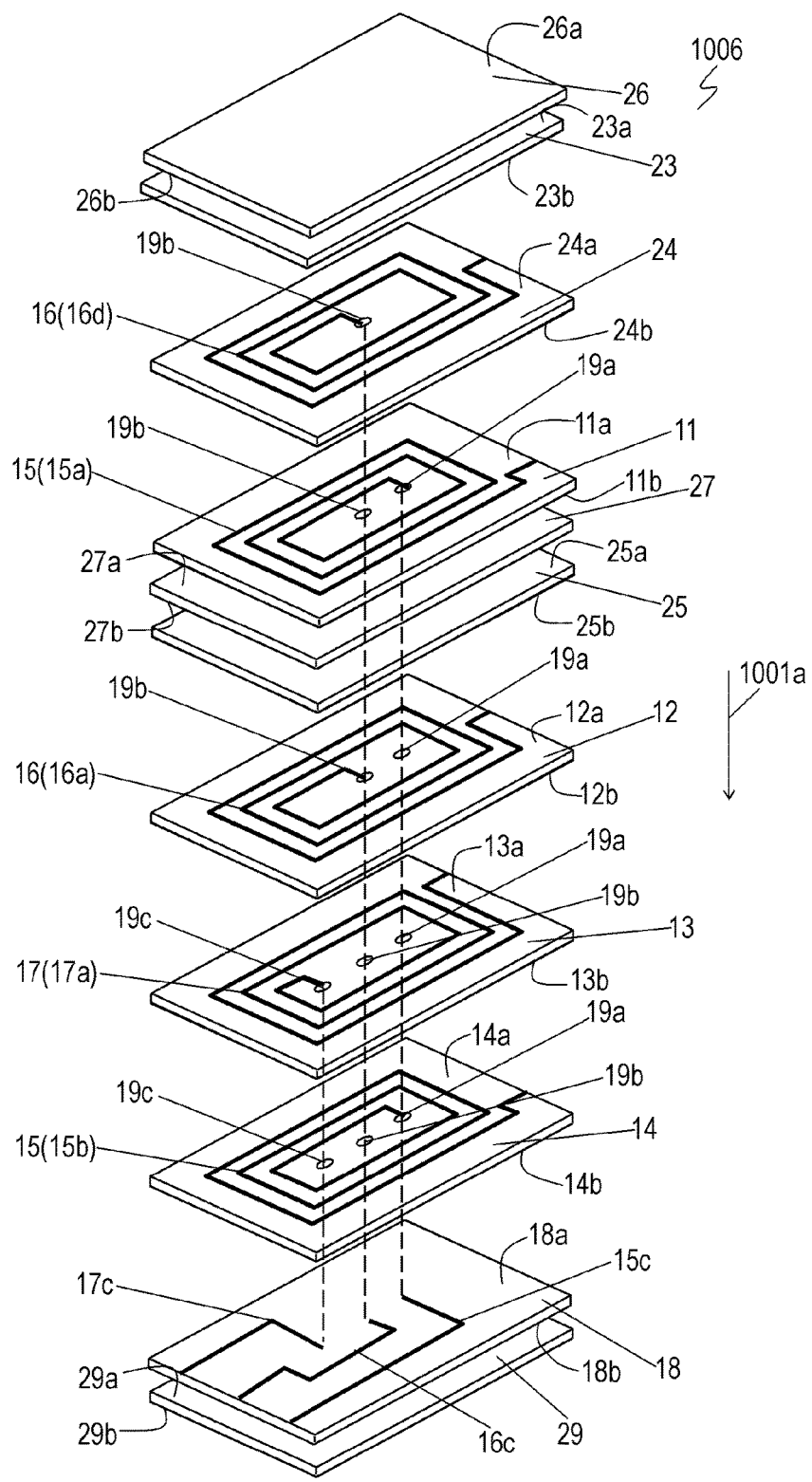
FIG. 9 is an exploded perspective view of a common mode noise filter according to Exemplary Embodiment 5.
Figure 10:
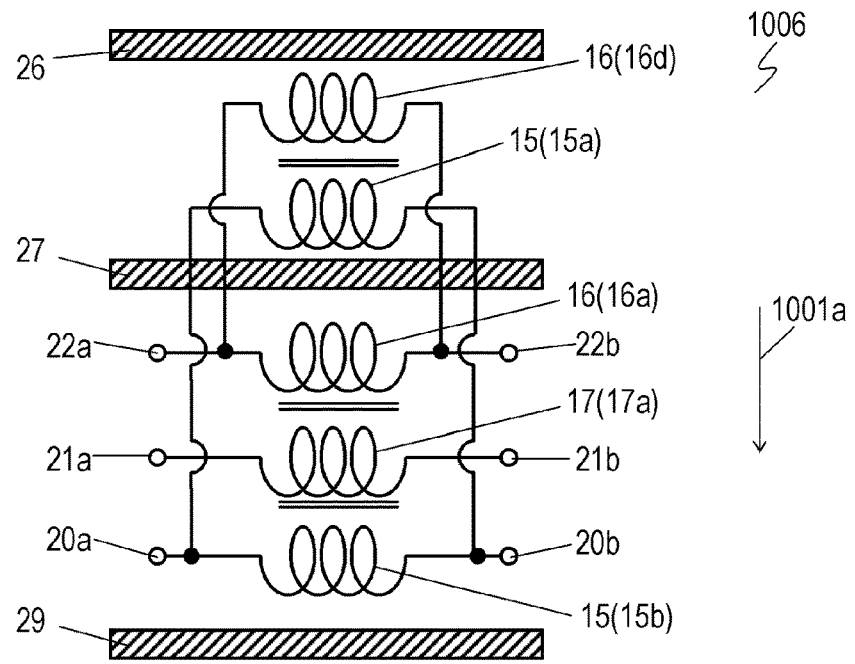
FIG. 10 is a circuit diagram of the common mode noise filter according to Embodiment 5.

FIG. 9 is an exploded perspective view of common mode noise filter 1006 according to Exemplary Embodiment 5. FIG. 10 is a circuit diagram of common mode noise filter 1006. In FIG. 9 and FIG. 10, components identical to those of common mode noise filter 1003 according to Embodiment 3 illustrated in FIG. 4 and FIG. 5 are denoted by the same reference numerals.

As illustrated in FIG. 9, common mode noise filter 1006 according to Embodiment 5 further includes coil conductor 16d provided above coil conductor 15a, insulator layer 26 located above coil conductors 15a and 16d, and insulator layers 23 to 25, 27 and 29. Insulator layers 26, 27, and 29 are made of magnetic material. Coil conductor 16d is connected in parallel to coil conductor 16a.

Insulator layers 26, 23, 24, 11, 27, 25, 12, 13, 14, 18, and 29 are stacked on one another in this order from above in stacking direction 1001a. Insulator layers 23 to 27 and 29 have upper surfaces 23a to 27a and 29a and lower surfaces 23b to 27b and 29b, respectively. Upper surface 29a of insulator layer 29 is provided on lower surface 18b of insulator layer 18. Lower surface 25b of insulator layer 25 is provided on upper surface 12a of insulator layer 12. Upper surface 25a of insulator layer 25 is situated on lower surface 27b of insulator layer 27. Upper surface 27a of insulator layer 27 is situated on lower surface 11b of insulator layer 11. Lower surface 24b of insulator layer 24 is situated on upper surface 11a of insulator layer 11. Upper surface 24a of insulator layer 24 is situated on lower surface 23b of insulator layer 23. Upper surface 23a of insulator layer 23 is situated on lower surface 26b of insulator layer 26. Coil conductor 16d is provided on upper surface 24a of insulator layer 24 and located between upper surface 24a of insulator layer 24 and lower surface 23b of insulator layer 23.

In other words, insulator layer 27 made of magnetic material is provided between coil conductors 15a and 16a. Insulator layer 26 made of magnetic material is an uppermost layer. Insulator layer 29 made of magnetic material is a lowermost layer.

Coil conductor 16d is provided on upper surface 24a of insulator layer 24 made of non-magnetic material. Coil conductors 15a, 15b, 16a, 16d, and 17a and wiring conductors 15c, 16c, and 17c are provided between insulator layer 25 and each of insulator layers 26, 27, and 29 made of magnetic material. Insulator layers 11 to 14, 18, and 23 to 25 are made of non-magnetic material.

In this configuration, the distance between a magnetic layer (insulator layers 27 and 29) and coil 15 (coil conductors 15a and 15b) and the distance between a magnetic layer (insulator layers 26 and 27) and coil 16 (coil conductors 16a and 16d) are small, and the distance between magnetic layer (insulator layers 27 and 29) and coil 17 (coil conductor 17a) is relatively small as well, resulting in a small difference in the impedance values of coils 15, 16, and 17. When differential signals are input to the three-core differential signal line, and a common mode filter unit including coil conductors 16d and 15a magnetically coupled with each other, a common mode filter unit including coil conductors 16a and 17a magnetically coupled with each other, and a common mode filter unit including coil conductors 17a and 15b magnetically coupled with each other operate, a loss due to components that cannot be magnetically coupled and is generated because of a difference in the inductance of the coils due to the differential signals is reduced, and thus variations in the differential signals passing through the common mode filter units are reduced.

Figure 11:
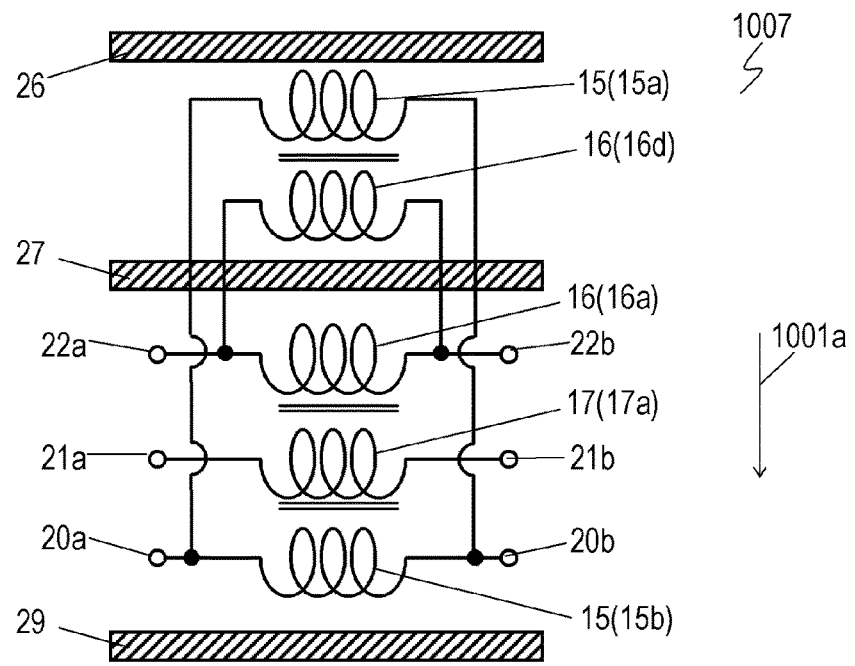
FIG. 11 is a circuit diagram of another common mode noise filter according to Embodiment 5.

FIG. 11 is a circuit diagram of another common mode noise filter 1007 according to Embodiment 5. In FIG. 11, components identical to those of common mode noise filter 1006 illustrated in FIG. 9 and FIG. 10 are denoted by the same reference numerals. Coil conductor 15a and coil conductor 16d are replaced with each other in common mode noise filter 1007 illustrated in FIG. 11. Specifically, coil conductor 15a is provided on upper surface 24a of insulator layer 24 while coil conductor 16d is provided on upper surface 11a of insulator layer 11. In common mode noise filter 1007, coil conductor 16a and coil conductor 16d which face each other have the same potential, hence reducing the influence of the stray capacitance between coil conductors 16a and 16d and reducing a deterioration of the differential signals passing through coil 16.

Exemplary Embodiment 6

Figure 12:
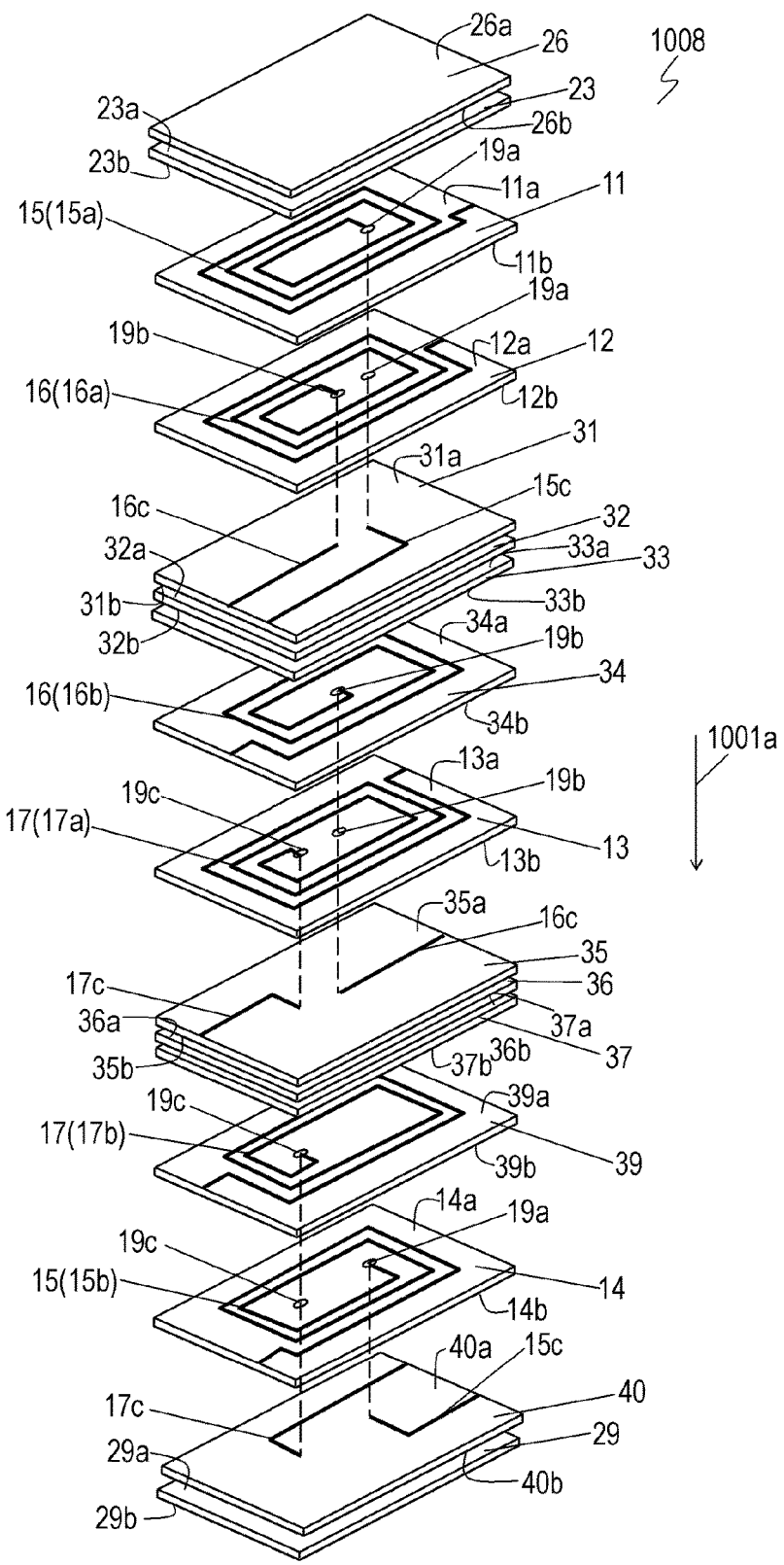
FIG. 12 is an exploded perspective view of a common mode noise filter according to Exemplary Embodiment 6.

FIG. 12 is an exploded perspective view of common mode noise filter 1008 according to Exemplary Embodiment 6. In FIG. 12, components identical to those of common mode noise filter 1002 according to Embodiment 2 illustrated in FIG. 2A, FIG. 2B, and FIG. 3 are denoted by the same reference numerals.

Common mode noise filter 1008 according to Exemplary Embodiment 6 further includes insulator layers 23, 26, 29, 31 to 37, 39, and 40. Insulator layers 23, 26, 29, 31 to 37, 39, and 40 have upper surfaces 23a, 26a, 29a, 31a to 37a, 39a, and 40a and lower surfaces 23b, 26b, 29b, 31b to 37b, 39b, and 40b, respectively. Lower surface 23b of insulator layer 23 is situated on upper surface 11a of insulator layer 11. Lower surface 26b of insulator layer 26 is situated on upper surface 23a of insulator layer 23. Upper surface 31a of insulator layer 31 is situated on lower surface 12b of insulator layer 12. Upper surface 32a of insulator layer 32 is situated on lower surface 31b of insulator layer 31. Upper surface 33a of insulator layer 33 is situated on lower surface 32b of insulator layer 32. Upper surface 34a of insulator layer 34 is situated on lower surface 33b of insulator layer 33. Upper surface 13a of insulator layer 13 is situated on lower surface 34b of insulator layer 34. Upper surface 35a of insulator layer 35 is situated on lower surface 13b of insulator layer 13. Upper surface 36a of insulator layer 36 is situated on lower surface 35b of insulator layer 35. Upper surface 37a of insulator layer 37 is situated on lower surface 36b of insulator layer 36. Upper surface 39a of insulator layer 39 is situated on lower surface 37b of insulator layer 37. Upper surface 14a of insulator layer 14 is situated on lower surface 39b of insulator layer 39. Upper surface 40a of insulator layer 40 is situated on lower surface 14b of insulator layer 14. Upper surface 29a of insulator layer 29 is situated on lower surface 40b of insulator layer 40.

Wiring conductors 15c and 16c are provided on upper surface 31a of insulator layer 31, that is, lower surface 12b of insulator layer 12, and are located between upper surface 31a of insulator layer 31 and lower surface 12b of insulator layer 12. Coil conductor 16b is provided on upper surface 34a of insulator layer 34, that is, lower surface 33b of insulator layer 33, and is located between upper surface 34a of insulator layer 34 and lower surface 33b of insulator layer 33. Wiring conductors 16c and 17c are provided on upper surface 35a of insulator layer 35, that is, lower surface 13b of insulator layer 13, and are located between upper surface 35a of insulator layer 35 and lower surface 13b of insulator layer 13. Coil conductor 17b is provided on upper surface 39a of insulator layer 39, that is, lower surface 37b of insulator layer 37, and is located between upper surface 39a of insulator layer 39 and lower surface 37b of insulator layer 37. Wiring conductors 15c and 17c are provided on upper surface 40a of insulator layer 40, that is, lower surface 14b of insulator layer 14, and are located between upper surface 40a of insulator layer 40 and lower surface 14b of insulator layer 14.

In common mode noise filter 1008 according to Embodiment 6, coil conductors 16a and 16b are arranged in stacking direction 1001a while coil conductors 17a and 17b are arranged in stacking direction 1001a. Insulator layer 32 located between coil conductors 16a and 16b, insulator layer 36 between coil conductors 17a and 17b, insulator layer 26 above coil conductor 15a, and insulator layer 29 below coil conductor 15b are made of magnetic material.

Insulator layers 23, 31, 33, 35, 37, and 40 are provided among coil conductors 15a, 15b, 16a, 16b, 17a, and 17b, wiring conductors 15c, 16c, and 17c, and insulator layers 26, 29, 32, and 36 made of magnetic material. Insulator layers 23, 31, 33, 35, 37, and 40 are made of non-magnetic material. Insulator layers 11 to 14 are made of non-magnetic material.

In common mode noise filter 1008 according to Embodiment 6, as in common mode noise filter 1002 according to Embodiment 2 illustrated in FIG. 3, coil conductors 16a and 16b are connected to each other via external electrodes 22a and 22b (see FIG. 3), coil conductors 17a and 17b are connected to each other via external electrodes 21a and 21b (see FIG. 3), and coil conductors 15a and 15b are connected to each other via external electrodes 20a and 20b (see FIG. 3).

These connections may be through via-electrodes 19a, 19b, and 19c. Since via-electrodes 19a, 19b, and 19c penetrate insulator layers 32 and 35 made of magnetic material, impedance attributed to the properties of the magnetic bodies occurs at via-electrodes 19a, 19b, and 19c in low frequency band, reducing noise in the low frequency band.

Each of insulator layer 32 located between coil conductors 16a and 16b, insulator layer 36 located between coil conductors 17a and 17b, insulator layer 26, and insulator layer 29 does not contact any of coil conductors 15a to 17a and 15b to 17b.

In the above-described configuration, a common mode filter unit including coil conductors 15a and 16a and wiring conductor 15c is sandwiched between insulator layers 26 and 32 which are made of magnetic body. A common mode filter unit including coil conductors 16b and 17a and wiring conductor 16c is sandwiched between insulator layers 32 and 35 which are made of magnetic body. A common mode filter unit including coil conductors 17b and 15b and wiring conductor 17c is sandwiched between insulator layers 29 and 36 which are made of magnetic body. In this configuration, the three common mode filter units have substantially the same properties, reducing variation of common mode noise removal properties between coils 15, 16, and 17 and reducing variation of the properties of passing of differential signals exhibited when the differential signals are input to the common mode filter units serving as a three-core differential signal line.

Figure 13:
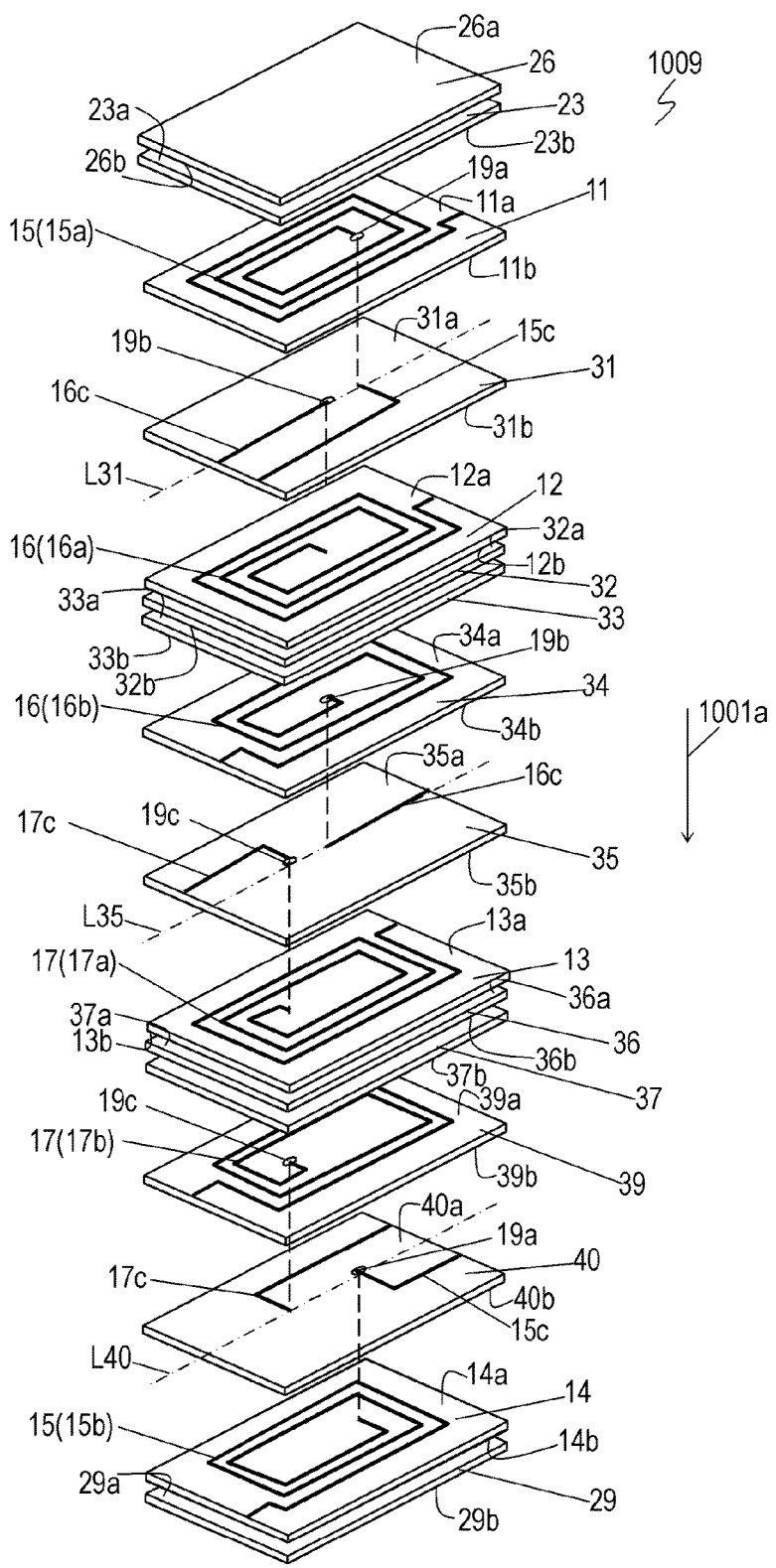
FIG. 13 is an exploded perspective view of another common mode noise filter according to exemplary embodiment 6.

FIG. 13 is an exploded perspective view of another common mode noise filter 1009 according to Embodiment 6. In FIG. 13, components identical to those of common mode noise filter 1008 illustrated in FIG. 12 are denoted by the same reference numerals. Common mode noise filter 1009 according to Embodiment 6 is different from common mode noise filter 1008 illustrated in FIG. 12 in the arrangement of the coil conductors, the wiring conductors, and the insulator layers.

In common mode noise filter 1009 illustrated in FIG. 13, upper surface 31a of insulator layer 31 is situated on lower surface 11b of insulator layer 11. Upper surface 12a of insulator layer 12 is situated on lower surface 31b of insulator layer 31. Upper surface 32a of insulator layer 32 is situated on lower surface 12b of insulator layer 12. Upper surface 33a of insulator layer 33 is situated on lower surface 32b of insulator layer 32. Upper surface 34a of insulator layer 34 is situated on lower surface 33b of insulator layer 33. Upper surface 35a of insulator layer 35 is situated on lower surface 34b of insulator layer 34. Upper surface 13a of insulator layer 13 is situated on lower surface 35b of insulator layer 35. Upper surface 36a of insulator layer 36 is situated on lower surface 13b of insulator layer 13. Upper surface 37a of insulator layer 37 is situated on lower surface 36b of insulator layer 36. Upper surface 39a of insulator layer 39 is situated on lower surface 37b of insulator layer 37. Upper surface 40a of insulator layer 40 is situated on lower surface 39b of insulator layer 39. Upper surface 14a of insulator layer 14 is situated on lower surface 40b of insulator layer 40. Upper surface 29a of insulator layer 29 is situated on lower surface 14b of insulator layer 14.

Wiring conductors 15c and 16c are provided on upper surface 31a of insulator layer 31, that is, lower surface 11b of insulator layer 11, and are located between upper surface 31a of insulator layer 31 and lower surface 11b of insulator layer 11. Coil conductor 16b is provided on upper surface 34a of insulator layer 34, that is, lower surface 33b of insulator layer 33, and is located between upper surface 34a of insulator layer 34 and lower surface 33b of insulator layer 33. Wiring conductors 16c and 17c are provided on upper surface 35a of insulator layer 35, that is, lower surface 34b of insulator layer 34, and are located between upper surface 35a of insulator layer 35 and lower surface 34b of insulator layer 34. Coil conductor 17b is provided on upper surface 39a of insulator layer 39, that is, lower surface 37b of insulator layer 37, and is located between upper surface 39a of insulator layer 39 and lower surface 37b of insulator layer 37. Wiring conductors 15c and 17c are provided on upper surface 40a of insulator layer 40, that is, lower surface 39b of insulator layer 39, and are located between upper surface 40a of insulator layer 40 and lower surface 39b of insulator layer 39.

In common mode noise filter 1009 illustrated in FIG. 13, wiring conductor 15c is disposed between coil conductors 15a and 16a, and wiring conductor 15c and coil conductors 15a and 16a form a common mode filter unit sandwiched between insulator layers 26 and 32 which are made of magnetic material. Wiring conductor 16c is disposed between coil conductors 16b and 17a, and wiring conductor 16c and coil conductors 16b and 17a form a common mode filter unit sandwiched between insulator layers 32 and 36 which are made of magnetic material. Wiring conductor 17c is disposed between coil conductors 17b and 15b, and wiring conductor 17c and coil conductors 17b and 15b form a common mode filter unit sandwiched between insulator layers 29 and 36 which are made of magnetic material. Thus, these three common mode filter units are sandwiched between insulator layers 26, 29, 32, and 36 which are made of magnetic material. The common mode filter units sandwiched between insulator layers 26, 29, 32, and 36 which are made of magnetic material are symmetrical in stacking direction 1001a. Specifically, coil conductors 15a and 16a constituting one common mode filter unit are symmetrical in stacking direction 1001a. Coil conductors 16b and 17a constituting another common mode filter unit are symmetrical in stacking direction 1001a. Coil conductors 15b and 17b constituting yet another common mode filter unit are symmetrical in stacking direction 1001a. Specifically, coil conductors 15a and 16a are symmetrical to each other with respect to straight line L31 which is perpendicular to stacking direction 1001a and located between coil conductors 15a and 16a. Coil conductors 16b and 17a are symmetrical to each other with respect to straight line L35 which is perpendicular to stacking direction 1001a and located between coil conductors 16b and 17a. Coil conductors 15b and 17b are symmetrical to each other with respect to straight line L40 which is perpendicular to stacking direction 1001a and located between coil conductors 15b and 17b. Therefore, the impedances of coils 15, 16, and 17 can be substantially identical to each other, reducing variation of common mode noise removal properties between coils 15, 16, and 17 and reducing variation of the properties of passing of differential signals exhibited when the differential signals are input to each of the three common mode filter units serving as a three-core differential signal line and pass the common mode filter unit.

In the exemplary embodiments, terms, such as "upper surface", "lower surface", "above", "below", and "downward", indicating directions indicate relative directions determined only by the relative positional relationship of components, such as insulator layers and coil conductors, of the common mode noise filters, and do not indicate absolute directions such as a vertical direction.

INDUSTRIAL APPLICABILITY

A common mode noise filter according to the present invention is useful as a small, thin common mode noise filter or the like used particularly in digital devices, audio/visual devices, information communication terminals, or the like.

REFERENCE MARKS IN THE DRAWINGS 11 insulator layer (first insulator layer)
12 insulator layer (second insulator layer)
13 insulator layer (third insulator layer)
14 insulator layer (fourth insulator layer)
15 coil (first coil)
15a coil conductor (first coil conductor)
15b coil conductor (second coil conductor)
15d coil conductor (eighth coil conductor)
15e coil conductor (seventh coil conductor)
16 coil (second coil)
16a coil conductor (third coil conductor)
16b coil conductor (fourth coil conductor)
16d coil conductor (fourth coil conductor)
17 coil (third coil)
17a coil conductor (fifth coil conductor)
17b coil conductor (sixth coil conductor)
17d coil conductor (sixth coil conductor)
18 insulator layer (fifth insulator layer)
26 insulator layer (fifth insulator layer)
28 insulator layer (sixth insulator layer)
29 insulator layer (sixth insulator layer)
38 insulator layer (seventh insulator layer)
48 insulator layer (eighth insulator layer)

The invention claimed is:

1. A common mode noise filter comprising:
a plurality of insulator layers including a first insulator layer, a second insulator layer, a third insulator layer, and a fourth insulator layer stacked in this order from above in a stacking direction; and
a first coil, a second coil, and a third coil that are provided on the first insulator layer, the second insulator layer, the third insulator layer, and the fourth insulator layer and are independent of one another, wherein the first coil includes a first coil conductor provided on the first insulator layer and a second coil conductor provided on the fourth insulator layer, the second coil conductor being connected to the first coil conductor;
a third coil conductor provided above the first coil conductor and connected in parallel to the second coil conductor; and
a fifth insulator layer provided above the first coil conductor and the third coil conductor, wherein
the second coil is provided on the second insulator layer,
the third coil is provided on the third insulator layer,
the first coil conductor overlaps the second coil when viewing the common mode noise filter from above,
at least a part of the second coil overlaps at least a part of the third coil when viewing the common mode noise filter from above,
the second coil conductor overlaps the third coil when viewing the common mode noise filter from above,
the first coil conductor is connected in parallel to the second coil conductor, and
an insulator layer out of the plurality of insulator layers which is located between the first coil conductor and the third coil conductor, an insulator layer out of the plurality of insulator layers which is located below the second coil conductor, and the fifth insulator layer are made of magnetic material.

2. The common mode noise filter according to claim 1, wherein the third coil conductor is provided below the first coil conductor.

3. A common mode noise filter comprising:
a plurality of insulator layers including a first insulator layer, a second insulator layer, a third insulator layer, and a fourth insulator layer stacked in this order from above in a stacking direction; and
a first coil, a second coil, and a third coil that are provided on the first insulator layer, the second insulator layer, the third insulator layer, and the fourth insulator layer and are independent of one another, wherein
the first coil includes a first coil conductor provided on the first insulator layer and a second coil conductor provided on the fourth insulator layer, the second coil conductor being connected to the first coil conductor,
the second coil is provided on the second insulator layer,
the third coil is provided on the third insulator layer,
the first coil conductor overlaps the second coil when viewing the common mode noise filter from above,
at least a part of the second coil overlaps at least a part of the third coil when viewing the common mode noise filter from above,
the second coil conductor overlaps the third coil when viewing the common mode noise filter from above,
the second coil includes a third coil conductor provided on the second insulator layer and a fourth coil conductor provided on the second insulator layer, the fourth coil conductor being connected to the third coil conductor,
the third coil includes a fifth coil conductor provided on the third insulator layer and a sixth coil conductor provided on the third insulator layer, the sixth coil conductor being connected to the fifth coil conductor,
the first coil conductor overlaps the third coil conductor of the second coil when viewing the common mode noise filter from above,
the fifth coil conductor overlaps the fourth coil conductor when viewing the common mode noise filter from above,
the sixth coil conductor overlaps the second coil conductor when viewing the common mode noise filter from above,
the first coil conductor of the first coil is connected in parallel to the second coil conductor of the first coil,
the third coil conductor of the second coil is connected in parallel to the fourth coil conductor of the second coil, and
the fifth coil conductor of the third coil is connected in parallel to the sixth coil conductor of the third coil.

4. A common mode noise filter comprising:
a plurality of insulator layers including a first insulator layer, a second insulator layer, a third insulator layer, and a fourth insulator layer stacked in this order from above in a stacking direction; and
a first coil, a second coil, and a third coil that are provided on the first insulator layer, the second insulator layer, the third insulator layer, and the fourth insulator layer and are independent of one another, wherein
the first coil includes a first coil conductor provided on the first insulator layer and a second coil conductor provided on the fourth insulator layer, the second coil conductor being connected to the first coil conductor, the second coil is provided on the second insulator layer,
the third coil is provided on the third insulator layer,
the first coil conductor overlaps the second coil when viewing the common mode noise filter from above,
at least a part of the second coil overlaps at least a part of the third coil when viewing the common mode noise filter from above,
the second coil conductor overlaps the third coil when viewing the common mode noise filter from above, and
the first coil conductor is connected in parallel to the second coil conductor.

5. The common mode noise filter according to claim 4, further comprising a fifth insulator layer, a sixth insulator layer, a seventh insulator layer, and an eighth insulator layer stacked in this order from above in the stacking direction from the fourth insulator layer, wherein
the second coil includes a third coil conductor provided on the second insulator layer and a fourth coil conductor provided on the seventh insulator layer, the fourth coil conductor being connected to the third coil conductor,
the third coil includes a fifth coil conductor provided on the third insulator layer and a sixth coil conductor provided on the sixth insulator layer, the sixth coil conductor being connected to the fifth coil conductor,
the first coil further includes a seventh coil conductor provided on the eighth insulator layer and an eighth coil conductor provided on the fifth insulator layer, the seventh coil conductor being connected to the first coil conductor, the eighth coil conductor being connected to the second coil conductor,
the first coil conductor of the first coil overlaps the third coil conductor of the second coil when viewing the common mode noise filter from above,
the third coil conductor of the second coil overlaps the fifth coil conductor of the third coil when viewing the common mode noise filter from above,
the second coil conductor of the first coil overlaps the fifth coil conductor of the third coil overlap when viewing the common mode noise filter from above,
the seventh coil conductor of the first coil overlaps the fourth coil conductor of the second coil when viewing the common mode noise filter from above,
the fourth coil conductor of the second coil overlaps the sixth coil conductor of the third coil when viewing the common mode noise filter from above, and
the eighth coil conductor of the first coil overlaps the sixth coil conductor of the third coil when viewing the common mode noise filter from above.

6. The common mode noise filter according to claim 5, wherein the fifth coil conductor and the sixth coil conductor of the third coil are located between the third coil conductor and the fourth coil conductor of the second coil in the stacking direction.

7. A common mode noise filter comprising:
a plurality of insulator layers including a first insulator layer, a second insulator layer, a third insulator layer, and a fourth insulator layer stacked in this order from above in a stacking direction; and
a first coil, a second coil, and a third coil that are provided on the first insulator layer, the second insulator layer, the third insulator layer, and the fourth insulator layer and are independent of one another, wherein
the first coil includes a first coil conductor provided on the first insulator layer and a second coil conductor provided on the fourth insulator layer, the second coil conductor being connected to the first coil conductor,
the second coil is provided on the second insulator layer,
the third coil is provided on the third insulator layer,
the first coil conductor overlaps the second coil when viewing the common mode noise filter from above,
at least a part of the second coil overlaps at least a part of the third coil when viewing the common mode noise filter from above,
the second coil conductor overlaps the third coil when viewing the common mode noise filter from above,
the plurality of insulator layers further include a fifth insulator layer provided above the first coil conductor and a sixth insulator layer provided below the second coil conductor,
the first coil conductor is connected in parallel to the second coil conductor,
the second coil includes a third coil conductor and a fourth coil conductor connected in parallel to each other,
the third coil includes a fifth coil conductor and a sixth coil conductor connected in parallel to each other,
the third coil conductor and the fourth coil conductor are arranged in the stacking direction,
the fifth coil conductor and the sixth coil conductor are arranged in the stacking direction, and
an insulator layer out of the plurality of insulator layers which is located between the third coil conductor and the fourth coil conductor, an insulator layer out of the plurality of insulator layers which is located between the fifth coil conductor and the sixth coil conductor, the fifth insulator layer, and the sixth insulator layer are made of magnetic material.

8. The common mode noise filter according to claim 7, wherein each of the insulator layer out of the plurality of insulator layers which is located between the third coil conductor and the fourth coil conductor, the insulator layer out of the plurality of insulator layers which is located between the fifth coil conductor and the sixth coil conductor, the fifth insulator layer, and the sixth insulator layer does not contact the first coil conductor, the second coil conductor, the third coil conductor, the fourth coil conductor, the fifth coil conductor, and the sixth coil conductor.

9. The common mode noise filter according to claim 7, wherein
the first coil conductor and the third coil conductor are disposed symmetrically to each other in the stacking direction,
the fourth coil conductor and the fifth coil conductor are disposed symmetrically to each other in the stacking direction, and
the second coil conductor and the sixth coil conductor are disposed symmetrically to each other in the stacking direction.

* * * * *